(12) United States Patent
Okabe et al.

(10) Patent No.: US 8,629,473 B2
(45) Date of Patent: Jan. 14, 2014

(54) SEMICONDUCTOR LIGHT-EMITTING ELEMENT, SEMICONDUCTOR LIGHT-EMITTING DEVICE, METHOD FOR PRODUCING SEMICONDUCTOR LIGHT-EMITTING ELEMENT, METHOD FOR PRODUCING SEMICONDUCTOR LIGHT-EMITTING DEVICE, ILLUMINATION DEVICE USING SEMICONDUCTOR LIGHT-EMITTING DEVICE, AND ELECTRONIC APPARATUS

(75) Inventors: Takehiko Okabe, Ichihara (JP); Kyousuke Masuya, Ichihara (JP)

(73) Assignee: Toyoda Gosei Co., Ltd., Aichi-ken (JP)

( * ) Notice: Subject to any disclaimer, the term of this patent is extended or adjusted under 35 U.S.C. 154(b) by 0 days.

(21) Appl. No.: 13/389,538

(22) PCT Filed: Jul. 26, 2010

(86) PCT No.: PCT/JP2010/062557
§ 371 (c)(1),
(2), (4) Date: Feb. 8, 2012

(87) PCT Pub. No.: WO2011/018942
PCT Pub. Date: Feb. 17, 2011

(65) Prior Publication Data
US 2012/0138999 A1 Jun. 7, 2012

(30) Foreign Application Priority Data

Aug. 13, 2009 (JP) ................................ 2009-187712

(51) Int. Cl.
*H01L 33/00* (2010.01)
*H01L 21/00* (2006.01)

(52) U.S. Cl.
USPC .......... 257/98; 257/99; 257/E33.072; 438/27; 438/28; 438/108

(58) Field of Classification Search
None
See application file for complete search history.

(56) References Cited

U.S. PATENT DOCUMENTS

| | | | |
|---|---|---|---|
| 2005/0184387 A1* | 8/2005 | Collins et al. | 257/712 |
| 2005/0212002 A1 | 9/2005 | Sanga et al. | |
| 2008/0042159 A1* | 2/2008 | Eitoh et al. | 257/103 |
| 2009/0184329 A1* | 7/2009 | Miki et al. | 257/79 |
| 2011/0012154 A1 | 1/2011 | Okagawa et al. | |

FOREIGN PATENT DOCUMENTS

| | | | |
|---|---|---|---|
| JP | 2005-317931 A | 11/2005 | |
| JP | 2007-165596 | * 6/2007 | |

(Continued)

OTHER PUBLICATIONS

International Search Report of PCT/JP2010/062557, dated Aug. 17, 2010.

*Primary Examiner* — Julio J Maldonado
*Assistant Examiner* — Harpreet Singh
(74) *Attorney, Agent, or Firm* — Sughrue Mion, PLLC

(57) ABSTRACT

The disclosed semiconductor light-emitting element is configured from layering an n-type semiconductor layer, a light-emitting layer, and a p-type semiconductor layer (160); and a first electrode (200), which is the cathode, is formed on the p-type semiconductor layer (160). Also, between the p-type semiconductor layer (160) and a reflecting layer (220b), the first electrode (200) is provided with a crystalline first transparent electrode layer (210) and a non-crystalline second transparent electrode layer (220a). The crystalline first transparent electrode layer (210) increases adhesion with the p-type semiconductor layer (160), and the non-crystalline second transparent electrode layer (220a) suppresses delamination of the reflecting layer (220b). Also, the first transparent electrode layer (210) and the second transparent electrode layer (220a) transmit light emitted from the light-emitting layer and suppress degradation of reflective characteristics. In this way, delamination of the reflecting layer and degradation of reflective characteristics are suppressed in a semiconductor light-emitting element mounted using flip-chip (FC) mounting.

14 Claims, 9 Drawing Sheets

(56) References Cited

FOREIGN PATENT DOCUMENTS

| JP | 2007-165596 A | 6/2007 |
| JP | 2008-041866 A | 2/2008 |
| JP | 2009-94107 | * 4/2009 |
| JP | 2009-094107 | * 4/2009 |
| JP | 2009-094107 A | 4/2009 |
| WO | WO 2009/084325 A1 | 7/2009 |

* cited by examiner

SEMICONDUCTOR LIGHT-EMITTING ELEMENT, SEMICONDUCTOR LIGHT-EMITTING DEVICE, METHOD FOR PRODUCING SEMICONDUCTOR LIGHT-EMITTING ELEMENT, METHOD FOR PRODUCING SEMICONDUCTOR LIGHT-EMITTING DEVICE, ILLUMINATION DEVICE USING SEMICONDUCTOR LIGHT-EMITTING DEVICE, AND ELECTRONIC APPARATUS

CROSS REFERENCE TO RELATED APPLICATIONS

This application is a National Stage of International Application No. PCT/JP2010/062557 filed Jul. 26, 2010, claiming priority based on Japanese Patent Application No. 2009-187712 filed Aug. 13, 2009 the contents of all of which are incorporated herein by reference in their entirety.

TECHNICAL FIELD

The present invention relates to a semiconductor light-emitting element, a semiconductor light-emitting device, a method for producing the semiconductor light-emitting element, a method for producing the semiconductor light-emitting device, an illumination device using the semiconductor light-emitting device, and an electronic apparatus.

BACKGROUND ART

Recently, a GaN-based compound semiconductor has become a focus of attention as a semiconductor material of the light-emitting element of short wavelength light. The GaN-based compound semiconductor is formed by a metal organic chemical vapor deposition method (MOCVD method), a molecular beam epitaxy method (MBE method) or the like on a sapphire single crystal or other various oxides or group III-V compounds provided as a substrate.

In a semiconductor light-emitting element using the GaN-based compound semiconductor, a laminated semiconductor layer having a light-emitting diode (LED) structure constituted by an n-type semiconductor layer, a light-emitting layer and a p-type semiconductor layer was formed on a substrate and an electrode having optical transparency (transparent electrode) was formed on the p-type semiconductor layer on the top portion, thereby extracting emitted light via the transparent electrode.

On some portions of the transparent electrode, which connect to bonding wires made of Au (gold), bonding pads made of Au or an alloy containing Au were formed. Since these bonding pads cut off light from the light-emitting layer, it was impossible to extract emitted light from the light-emitting layer through the portions on the transparent electrode where the bonding pads were formed.

Further, in the semiconductor light-emitting element, light traveling toward the transparent electrode and light traveling toward the substrate are emitted from the light-emitting layer. Of these, the light traveling toward the substrate was absorbed by a package on which the substrate and the semiconductor light-emitting element were mounted or by an adhesive that bonds the semiconductor light-emitting element to the package, and therefore, the light traveling toward the substrate was difficult to be extracted to the outside.

In contrast, by an FC (flip-chip bonding) mount technology, in which a semiconductor light-emitting element formed on a substrate that is transparent to light emission wavelength is reversed and mounted on a circuit board (submount) or a package, light is extracted from a substrate side where no electrodes are formed to avoid light exclusion by electrodes, and thereby light extraction efficiency is improved.

Moreover, since, in the semiconductor light-emitting element and the circuit board (submount), the electrodes of the semiconductor light-emitting element and pads of wiring on the circuit board (submount) are connected with each other via bumps made of Au or the like, an area on the circuit board (submount) required for mounting of the semiconductor light-emitting element is reduced and mounting can be performed in high density, with high reliability in connection compared to the method of connection with bonding wires.

By the way, for using the FC mount technology, the semiconductor light-emitting element is configured such that both of the positive electrode and the negative electrode are taken out from a front surface side of the laminated semiconductor layer, which is opposite to the substrate, and a reflecting layer made of Ag (silver) or the like, which has high reflectance to the light emission wavelength, is provided on the front surface side of the laminated semiconductor layer. Consequently, the light traveling toward the electrodes is reflected and extracted from the substrate side, and accordingly, the light extraction efficiency is further improved.

In the Patent Document 1, a semiconductor light-emitting element is disclosed, in which a first conduction type semiconductor layer, a light-emitting layer, and a second conduction type semiconductor layer are laminated in this order, and an electrode connected to the second conduction type semiconductor layer includes a lower layer conductive oxide film, an upper layer conductive oxide film which is formed on the lower layer conductive oxide film so that a part of a front surface of the lower layer conductive oxide film may be exposed, and a metal film disposed only on the upper layer conductive oxide film. The lower layer conductive oxide film functions as a non-reflective film at the region where the metal film is not disposed, and the upper layer conductive oxide film functions as a reflective film having high reflectance to the light emission wavelength at the region where the metal film is disposed.

CITATION LIST

Patent Literature

Patent Document 1: Japanese Patent Application Laid-open Publication No. 2005-317931

SUMMARY OF INVENTION

Technical Problem

In the FC-mounted semiconductor light-emitting element, the reflecting layer is formed on the laminated semiconductor layer made of gallium nitride (GaN) or the like.

However, there are not necessarily excellent adhesiveness (bonding characteristics) between the laminated semiconductor layer and the reflecting layer. In the case where the adhesiveness are not good and the reflecting layer is apt to be delaminated, a bonding layer is interposed to improve the adhesiveness between the laminated semiconductor layer and the reflecting layer.

Since the reflecting layer also works as the electrode, the bonding layer is required to have conductivity, and to make an ohmic contact with each of the laminated semiconductor layer and the reflecting layer. Further, since the bonding layer exists between the reflecting layer and the laminated semiconductor layer, the bonding layer degrades reflective characteristics in the case where optical transparency to the light emission wavelength from the light-emitting layer is poor.

It is an object of the present invention to suppress delamination of the reflecting layer of the semiconductor light-emitting element mounted by flip-chip (FC) bonding and degradation of reflective characteristics.

Solution to Problem

In order to attain the object, a semiconductor light-emitting element to which the present invention is applied includes: a laminated semiconductor layer in which a first semiconductor layer having a first conduction type, a light-emitting layer, and a second semiconductor layer having a second conduction type that is opposite to the first conduction type are laminated in order; a first transparent electrode layer that is provided on the laminated semiconductor layer, has transparency to light emitted from the light-emitting layer and is crystalline; a second transparent electrode layer that is provided on the first transparent electrode layer, has transparency to the light and is non-crystalline; and a reflecting layer that is provided on the second transparent electrode layer and is reflective to the light.

Such a semiconductor light-emitting element can be characterized in that the first transparent electrode layer which is crystalline and the second transparent electrode layer which is non-crystalline are conductive oxides.

Further, the semiconductor light-emitting element can be characterized in that the first transparent electrode layer which is crystalline and the second transparent electrode layer which is non-crystalline are conductive oxides containing any one of indium (In) and titanium (Ti).

Then, a thickness of the first transparent electrode layer which is crystalline can be characterized to be in a range of 5 nm or more to 500 nm or less. On the other hand, a thickness of the second transparent electrode layer which is non-crystalline can be characterized to be in a range of 1 nm or more to 5 nm or less. Further, the reflecting layer can be characterized to be any one of Ag and a metal containing Ag.

Moreover, the laminated semiconductor layer can be characterized in that the first conduction type of the first semiconductor layer is an n-type in which a carrier is an electron and the second conduction type of the second semiconductor layer is a p-type in which a carrier is a hole.

Still further, a semiconductor light-emitting device to which the present invention is applied includes: a semiconductor light-emitting element including: a laminated semiconductor layer in which a first semiconductor layer having a first conduction type, a light-emitting layer and a second semiconductor layer having a second conduction type that is opposite to the first conduction type are laminated in order; a first transparent electrode layer that is provided on the laminated semiconductor layer, has transparency to light emitted from the light-emitting layer and is crystalline; a second transparent electrode layer that is provided on the first transparent electrode layer, has transparency to the light and is non-crystalline; and a reflecting layer that is provided on the second transparent electrode layer and is reflective to the light; and a circuit board that is arranged to face a side including the reflecting layer of the semiconductor light-emitting element.

Such a semiconductor light-emitting device can be characterized in that, in the semiconductor light-emitting element and the circuit board, a pair of positive and negative connecting electrodes provided on the side including the reflecting layer of the semiconductor light-emitting element is connected to a pair of wirings provided on the circuit board by a connector provided on the circuit board.

By the way, from another point of view, a method for producing a semiconductor light-emitting element to which the present invention is applied includes: a process that forms a laminated semiconductor layer including a first semiconductor layer having a first conduction type, a light-emitting layer and a second semiconductor layer having a second conduction type that is opposite to the first conduction type; a process that forms a first transparent electrode layer on the laminated semiconductor layer, the first transparent electrode layer having transparency to light emitted from the light-emitting layer, and being crystalline; a process that forms a second transparent electrode layer on the first transparent electrode layer, the second transparent electrode layer having transparency to the light, and being non-crystalline; and a process that forms a reflecting layer on the second transparent electrode layer, the reflecting layer reflecting the light.

The process that forms a first transparent electrode layer can be characterized by including a process that deposits a film to be the first transparent electrode layer and a process that applies heat treatment for crystallizing the film.

Further, a method for producing a semiconductor light-emitting device to which the present invention is applied includes: a process that performs alignment to bring a pair of positive and negative connecting electrodes provided on a side including a reflecting layer of a semiconductor light-emitting element into correspondence with a pair of wirings provided on a circuit board, the semiconductor light-emitting element including: a laminated semiconductor layer in which a first semiconductor layer having a first conduction type, a light-emitting layer and a second semiconductor layer having a second conduction type that is opposite to the first conduction type are laminated in order; a first transparent electrode layer that is provided on the laminated semiconductor layer, has transparency to light emitted from the light-emitting layer and is crystalline; a second transparent electrode layer that is provided on the first transparent electrode layer, has transparency to the light and is non-crystalline; and the reflecting layer that is provided on the second transparent electrode layer and is reflective to the light; and a process that heats and presses the semiconductor light-emitting element against the circuit board.

Next, an illumination device to which the present invention is applied incorporates: a semiconductor light-emitting device including a semiconductor light-emitting element that includes: a laminated semiconductor layer in which a first semiconductor layer having a first conduction type, a light-emitting layer and a second semiconductor layer having a second conduction type that is opposite to the first conduction type are laminated in order; a first transparent electrode layer that is provided on the laminated semiconductor layer, has transparency to light emitted from the light-emitting layer and is crystalline; a second transparent electrode layer that is provided on the first transparent electrode layer, has transparency to the light and is non-crystalline; and a reflecting layer that is provided on the second transparent electrode layer and is reflective to the light; and a circuit board that is arranged to face a side including the reflecting layer of the semiconductor light-emitting element.

Further, an electronic apparatus to which the present invention is applied incorporates: a semiconductor light-emitting device including a semiconductor light-emitting element that includes: a laminated semiconductor layer in which a first semiconductor layer having a first conduction type, a light-emitting layer and a second semiconductor layer having a second conduction type that is opposite to the first conduction type are laminated in order; a first transparent electrode layer that is provided on the laminated semiconductor layer, has transparency to light emitted from the light-emitting layer and is crystalline; a second transparent electrode layer that is provided on the first transparent electrode layer, has transparency to the light and is non-crystalline; and a reflecting layer that is provided on the second transparent electrode layer and is reflective to the light; and a circuit board that is arranged to face a side including the reflecting layer of the semiconductor light-emitting element.

Advantageous Effects of Invention

The semiconductor light-emitting element according to the present invention is capable of suppressing, by forming the crystalline first transparent electrode layer and the non-crystalline second transparent electrode layer on the laminated semiconductor layer in which the n-type first semiconductor layer, the light-emitting layer and the p-type second semiconductor layer are laminated in this order, delamination from the reflecting layer at the upper portion. Moreover, the semiconductor light-emitting element according to the present invention has low forward voltage Vf, thereby capable of being a semiconductor light-emitting element with large light emission output.

DESCRIPTION OF EMBODIMENTS

An exemplary embodiment according to the present invention will be described in detail below with reference to the accompanying drawings.

Figure 1:
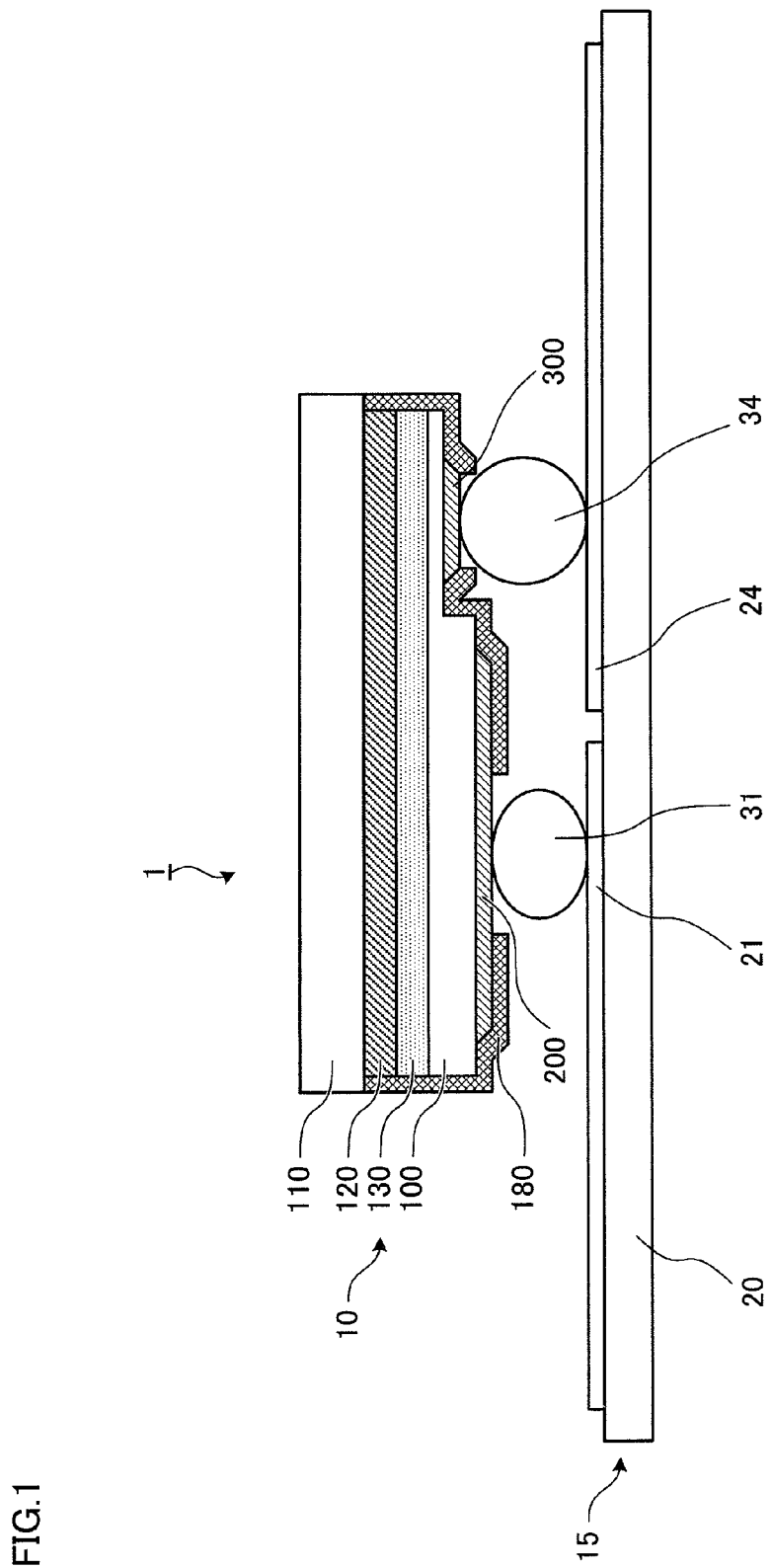
FIG. 1 is a diagram showing an example of a cross-sectional schematic configuration diagram of a semiconductor light-emitting device to which the exemplary embodiment is applied.

FIG. 1 is a diagram showing an example of a cross-sectional schematic configuration diagram of a semiconductor light-emitting device 1 to which the exemplary embodiment is applied.

The semiconductor light-emitting device 1 includes a semiconductor light-emitting element 10 that emits light and a submount 15 as an example of a circuit board on which wirings for supplying electric power to the semiconductor light-emitting element 10 are provided and to which the semiconductor light-emitting element 10 is secured.

The semiconductor light-emitting element 10 includes: a substrate 110; an intermediate layer 120; a base layer 130; and a laminated semiconductor layer 100. The semiconductor light-emitting element 10 also includes a first electrode 200 working as a positive electrode and a second electrode 300 working as a negative electrode, which are an example of a pair of positive and negative connecting electrodes. It should be noted that the second electrode 300 is provided to a portion where a part of the laminated semiconductor layer 100 is cutout.

There is provided a protecting layer 180 that covers top and side surfaces of the intermediate layer 120, the base layer 130 and the laminated semiconductor layer 100 except for a part of top surfaces of the first electrode 200 and the second electrode 300.

It should be noted that details of the semiconductor light-emitting element 10 will be described later.

The submount 15 includes: a submount substrate 20; submount wirings 21 and 24 that are provided on the submount substrate 20; and bumps 31 and 34 as an example of a connector that electrically connects the first electrode 200 and the second electrode 300 of the semiconductor light-emitting element 10 with the submount wirings 21 and 24, respectively.

In FIG. 1, the substrate 110 is located on an upper side of the semiconductor light-emitting element 10. That is, the semiconductor light-emitting element 10 is reversed and mounted on the submount 15. To reverse and mount the semiconductor light-emitting element 10 on the submount 15 in this manner is referred to as flip-chip (FC) mounting or flip-chip (FC) bonding. This mounting system is also referred to as face-down (FD) mounting since the semiconductor light-emitting element 10 is reversed to be mounted.

Description will be provided on light extraction in the exemplary embodiment. Of the light emitted from the laminated semiconductor layer 100 (specifically, a light-emitting layer 150 in FIG. 2, which will be described later) of the semiconductor light-emitting element 10, light traveling toward the substrate 110 is extracted to the outside (upper direction in FIG. 1). On the other hand, of the light emitted from the light-emitting layer 150, light traveling toward the first electrode 200 is reflected by a reflecting layer (a reflecting layer 220b in FIG. 5, which will be described later) that shows high light reflectivity to the light emitted from the light-emitting layer 150, proceeds toward the substrate 110, and is extracted to the outside (upper direction in FIG. 1). There is also light extracted to the outside from the side surface of the laminated semiconductor layer 100, the intermediate layer 120 or the base layer 130.

Hereinafter, detailed configuration of the submount 15 and the semiconductor light-emitting element 10 will be described in this order.

(Submount)

In the submount 15, as the submount substrate 20, various kinds of substrates which are insulative or conductive, such as a ceramic substrate, an MN (aluminum nitride) substrate, an Al (aluminum) substrate, a Cu (cupper) substrate and a glass epoxy substrate can be selected and used without any particular limitations.

It should be noted that, in the case where the conductive substrate such as an Al substrate is used, at least one of the submount wirings 21 and 24 is provided via an insulating layer for electrically insulating the submount wirings 21 and 24 from the submount substrate 20.

As the bumps 31 and 34 that connect the first electrode 200 and the second electrode 300 of the semiconductor light-emitting element 10 with the submount wirings 21 and 24 of the submount substrate 20, respectively, Sn (tin)-added Au (Au—Sn alloy) balls or solder balls can be used, for example. Especially, an Au—Sn alloy with a heating temperature of about 300° C. in connecting (contact bonding) is preferred.

Hereinafter, detailed configuration of the semiconductor light-emitting element 10 will be described.
(Semiconductor Light-Emitting Element)

Figure 2:
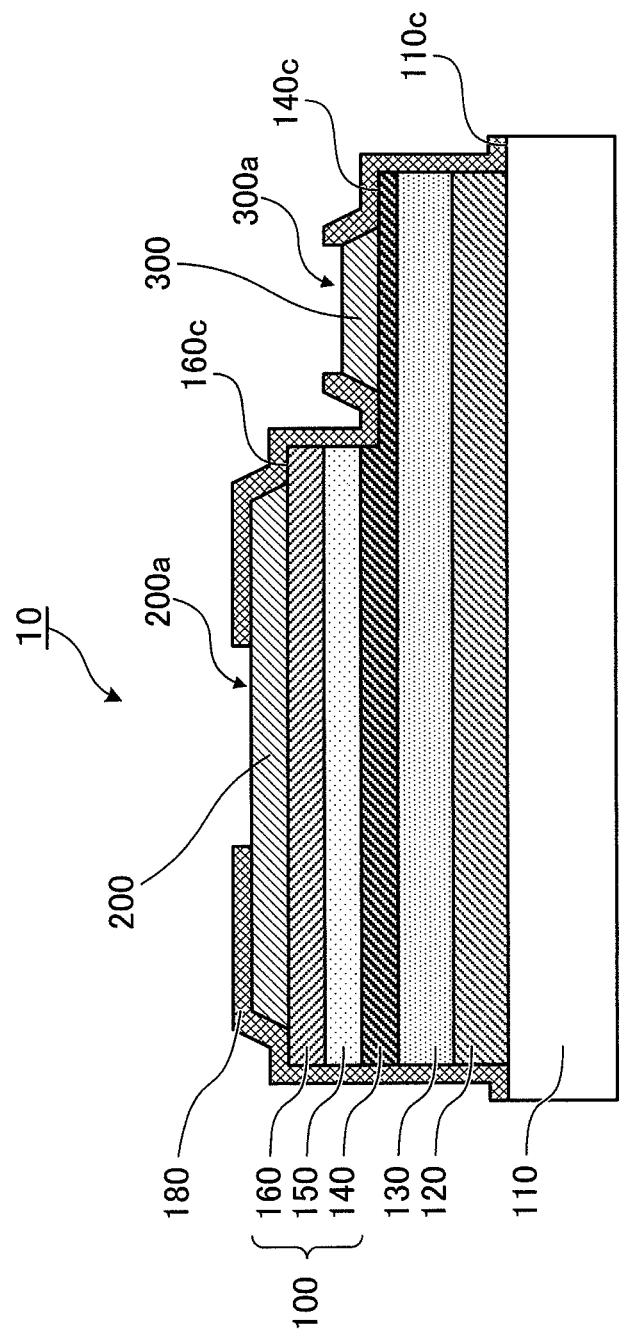
FIG. 2 is a diagram showing an example of a cross-sectional schematic configuration diagram of a semiconductor light-emitting element.

FIG. 2 is a diagram showing an example of a cross-sectional schematic configuration diagram of the semiconductor light-emitting element 10. In FIG. 1, the semiconductor light-emitting element 10 is reversed and mounted on the circuit board (submount) 15. In FIG. 2, description will be given in the state where the semiconductor light-emitting element 10 is not reversed to facilitate understanding. In other words, in FIG. 2, the substrate 110 is located to be on a lower side.

Figure 3:
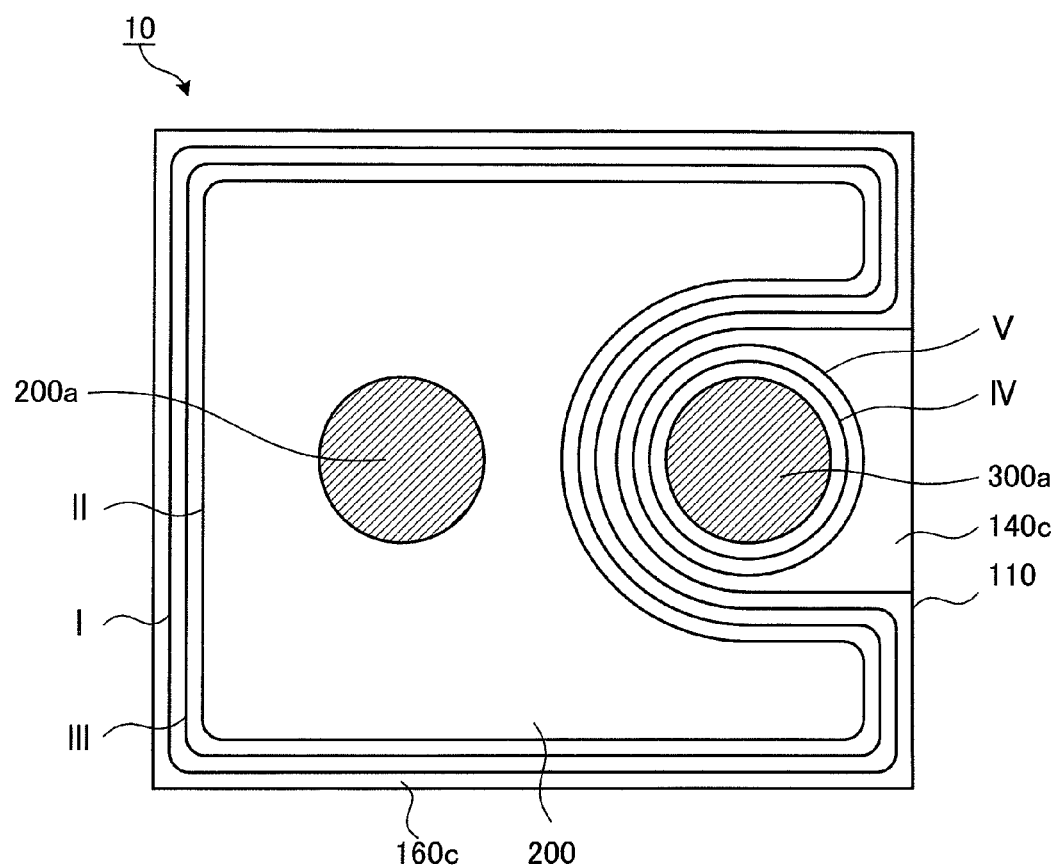
FIG. 3 is a diagram showing an example of a planar schematic configuration diagram of the semiconductor light-emitting element.

FIG. 3 is a diagram showing an example of a planar schematic configuration diagram of the semiconductor light-emitting element 10 shown in FIG. 2. The planar diagram in FIG. 3 shows the semiconductor light-emitting element 10 in FIG. 2 as viewed from the side of the first electrode 200 and the second electrode 300.

As shown in FIG. 2, the semiconductor light-emitting element 10 includes: the substrate 110; the intermediate layer 120 laminated on the substrate 110; the base layer 130 laminated on the intermediate layer 120; and the laminated semiconductor layer 100 laminated on the base layer 130. The laminated semiconductor layer 100 includes: an n-type semiconductor layer 140 as an example of a first semiconductor layer; the light-emitting layer 150 laminated on the n-type semiconductor layer 140; and a p-type semiconductor layer 160, as an example of a second semiconductor layer, laminated on the light-emitting layer 150. Further, the semiconductor light-emitting element 10 includes the first electrode 200 laminated on a surface 160c of the p-type semiconductor layer 160. Still further, the semiconductor light-emitting element 10 includes the second electrode 300 laminated on a part of a semiconductor layer exposure surface 140c of the n-type semiconductor layer 140 exposed by cutting a part of the p-type semiconductor layer 160, the light-emitting layer 150 and the n-type semiconductor layer 160. Furthermore, the semiconductor light-emitting element 10 includes the protecting layer 180 provided to cover the top and side surfaces of the laminated semiconductor layer 100, the side surfaces of the intermediate layer 120 and the base layer 130, and the top surfaces of the first electrode 200 and the second electrode 300 except for a part of each thereof. The protecting layer 180 includes an opening 200a provided to the first electrode 200 and an opening 300a provided to the second electrode 300. The first electrode 200 and the second electrode 300 are connected to the bumps 31 and 34, respectively, via the openings 200a and 300a.

In the semiconductor light-emitting element 10, the first electrode 200 and the second electrode 300 are supposed to be the positive electrode and the negative electrode, respectively, and the light-emitting layer 150 emits light by passing a current through the laminated semiconductor layer 100 (more specifically, the p-type semiconductor layer 160, the light-emitting layer 150 and the n-type semiconductor layer 140) via these electrodes.

Next, each constituent of the semiconductor light-emitting element 10 will be described in more detail.

<Substrate>

As the substrate 110, there is no particular limitation on any substrate as long as group III nitride semiconductor crystals are epitaxially grown on a surface thereof, and accordingly, various kinds of substrate can be selected and used. However, as will be described later, since the semiconductor light-emitting element 10 of the exemplary embodiment is FC-mounted so that the light is extracted from the substrate 110 side, it is preferable to have transparency to the light emitted from the light-emitting layer 150. Accordingly, the substrate 110 composed of, for example, sapphire, zinc oxide, magnesium oxide, zirconium oxide, magnesium-aluminum oxide, gallium oxide, indium oxide, lithium-gallium oxide, lithium-aluminum oxide, neodium-gallium oxide, lanthanum-strontium-aluminum-tantalum oxide, strontium-titanium oxide, titanium oxide and the like can be used.

Moreover, among the above-described substrates, it is preferable to use the sapphire substrate 110 whose (0001) surface (c-face) is a principal surface. In the case where the sapphire substrate is used, the intermediate layer 120 (buffer layer) may be formed on the c-face 110c of the sapphire.

<Intermediate Layer>

The intermediate layer 120 is preferably composed of polycrystal $Al_xGa_{1-x}N$ ($0 \leq x \leq 1$), and more preferably, composed of single crystal $Al_xGa_{1-x}N$ ($0 \leq x \leq 1$).

The intermediate layer 120 can be, for example, composed of polycrystal $Al_xGa_{1-x}N$ ($0 \leq x \leq 1$) with a thickness of 0.01 μm to 0.5 μm. If the thickness of the intermediate layer 120 is less than 10 nm, there are some cases where an effect of the intermediate layer 120 to mediate the difference in lattice constant between the substrate 110 and the base layer 130 cannot be sufficiently obtained. On the other hand, if the thickness of the intermediate layer 120 is more than 0.5 μm, there is a possibility that the time of forming process of the intermediate layer 120 becomes longer though there is no change to the function of the intermediate layer 120, and accordingly the productivity is decreased.

The intermediate layer 120 has a function of mediating the difference in lattice constant between the substrate 110 and the base layer 130 to facilitate the formation of a single crystal layer which is C-axis oriented on the (0001) surface (c-face) of the sapphire of the substrate 110. Consequently, if a single crystal base layer 130 is laminated on the intermediate layer 120, the base layer 130 having more excellent crystallinity can be laminated. It should be noted that the intermediate layer forming process is preferably carried out in the present invention, but not necessarily needed.

Moreover, the crystal of the group III nitride semiconductor constituting the intermediate layer 120 may have a single crystal structure, and those having a single crystal structure are preferably used. Crystals of the group III nitride semiconductor grow not only in an upper direction but also in an in-plane direction with respect to the substrate 110 to form a single crystal structure by controlling growing conditions. Accordingly, the intermediate layer 120 can be composed of the group III nitride semiconductor crystals having single crystal structure by controlling layer forming conditions thereof. In the case where the intermediate layer 120 having such a single crystal structure is formed on the substrate 110, the buffer function of the intermediate layer 120 effectively works, and thereby the group III nitride semiconductor formed thereon becomes a crystal film having excellent orientation property and crystallinity.

Furthermore, it is possible to provide the group III nitride semiconductor crystals constituting the intermediate layer 120 as columnar crystals (polycrystals) composed of an aggregate structure based on hexagonal columns by controlling layer forming conditions. It should be noted that the columnar crystals composed of an aggregate structure described here refers to crystals which are separated from adjacent crystal grains by crystal grain boundaries formed therebetween, and are columnar by themselves in a longitudinal sectional shape.

<Base Layer>

As the base layer 130, $Al_xGa_yIn_zN$ (0≤x≤1, 0≤y≤1, 0≤z≤1, x+y+z=1) can be used, but it is preferable to use $Al_xGa_{1-x}N$ (0≤x<1) because the base layer 130 with excellent crystallinity can be formed.

The thickness of the base layer 130 is preferably 0.1 μm or more, more preferably 0.5 μm or more, and most preferably 1 μm or more. The $Al_xGa_{1-x}N$ layer having excellent crystallinity is likely to be obtained with these layer thickness or more.

To improve the crystallinity of the base layer 130, it is desirable that the base layer 130 is not doped with impurities. However, if conductivity of p-type or n-type is needed, p-type impurities or n-type impurities can be added.

<Laminated Semiconductor Layer>

The laminated semiconductor layer is composed of, for example, the group III nitride semiconductor, which is configured by laminating the n-type semiconductor layer 140, the light-emitting layer 150 and the p-type semiconductor layer 160 on the substrate 110 in this order as shown in FIG. 2.

Further, each of the n-type semiconductor layer 140, the light-emitting layer 150 and the p-type semiconductor layer 160 may be configured by plural semiconductor layers.

Here, the n-type semiconductor layer 140 performs electrical conduction of a first conduction type in which an electron is a carrier, while the p-type semiconductor layer 160 performs electrical conduction of a second conduction type in which a hole is a carrier.

It should be noted that the laminated semiconductor layer 100 with excellent crystallinity can be obtained by forming by an MOCVD method, however, a sputtering method under optimized conditions can form the laminated semiconductor layer 100 having more excellent crystallinity than that formed by the MOCVD method. Hereinafter, descriptions will be sequentially given.

<N-Type Semiconductor Layer>

Figure 4:
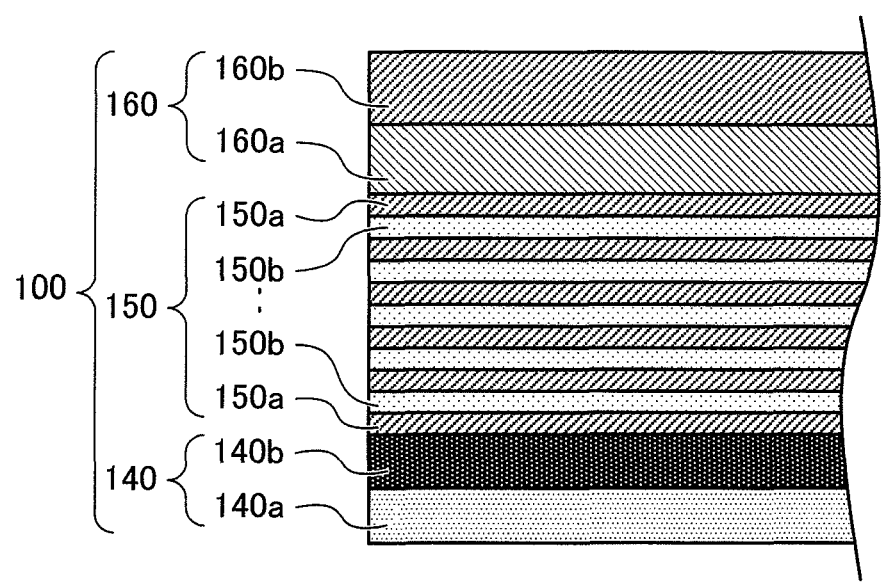
FIG. 4 is a diagram showing an example of a cross-sectional schematic configuration diagram of a laminated semiconductor layer.

FIG. 4 is a diagram showing an example of a cross-sectional schematic configuration diagram of the laminated semiconductor layer 100. The n-type semiconductor layer 140 is preferably configured with an n-contact layer 140a and an n-cladding layer 140b. It should be noted that the n-contact layer 140a can also serve as the n-cladding layer 140b. Further, the above-described base layer 130 may be included in the n-type semiconductor layer 140.

The n-contact layer 140a is a layer for providing the second electrode 300. The n-contact layer 140a is preferably configured with the $Al_xGa_{1-x}N$ layer (0≤x<1, more preferably 0≤x≤0.5, and still more preferably 0≤x≤0.1).

Further, the n-contact layer 140a is preferably doped with n-type impurities, and preferably contains the n-type impurities having a density of $1×10^{17}/cm^3$ to $1×10^{20}/cm^3$, and preferably a density of $1×10^{18}/cm^3$ to $1×10^{19}/cm^3$ on the point that a good ohmic contact with the second electrode 300 can be maintained. The n-type impurities are not particularly limited, however, Si, Ge, Sn and so on are provided, and Si and Ge are preferably provided.

The thickness of the n-contact layer 140a is preferably set to 0.5 μm to 5 μm, and more preferably set in a range of 1 μm to 3 μm. If the layer thickness of the n-contact layer 140a is in the above-described ranges, crystallinity of the semiconductor is suitably maintained.

It is preferable to provide the n-cladding layer 140b between the n-contact layer 140a and the light-emitting layer 150. The n-cladding layer 140b performs injection of the carriers into the light-emitting layer 150 and confinement of the carriers. The n-cladding layer 140b can be formed of AlGaN, GaN, GaInN and so on. The hetero junction structure or the superlattice structure in which the layer is laminated plural times of these structures may also be used. When the n-cladding layer 140b is formed of GaInN, the band gap thereof is preferably larger than that of GaInN of the light-emitting layer 150.

The thickness of the n-cladding layer 140b is not particularly limited, but preferably in a range of 0.005 μm to 0.5 μm, and more preferably in a range of 0.005 μm to 0.1 μm. The impurity concentration of the n-cladding layer 140b is preferably in a range of $1×10^{17}/cm^3$ to $1×10^{20}/cm^3$, and more preferably in a range of $1×10^{18}/cm^3$ to $1×10^{19}/cm^3$. It is preferable to provide the impurity concentration in these ranges in terms of maintaining excellent crystallinity and reducing operation voltage of the light-emitting element.

It should be noted that, in the case where the n-cladding layer 140b is a layer containing the superlattice structure, the layer may contain a structure in which an n-side first layer composed of the group III nitride semiconductor with a thickness of 10 nm or less and an n-side second layer having a different composition from the n-side first layer and composed of the group III nitride semiconductor with a thickness of 10 nm or less are laminated, though detailed illustration is omitted.

Further, the n-cladding layer 140b may contain a structure in which the n-side first layers and the n-side second layers are alternately and repeatedly laminated, and the structure is preferably an alternating structure of GaInN and GaN or an alternating structure of GaInN having different compositions.

<Light-Emitting Layer>

As the light-emitting layer 150 laminated on the n-type semiconductor layer 140, a single quantum well structure or a multiple quantum well structure can be employed.

As a well layer 150b having a quantum well structure as shown in FIG. 4, the group III nitride semiconductor layer composed of $Ga_{1-y}In_yN$ (0<y<0.4) is usually used. The thickness of the well layer 150b may be the thickness by which quantum effects can be obtained, for example, 1 nm to 10 nm, and is preferably 2 nm to 6 nm in terms of light emission output.

Moreover, in the case of the light-emitting layer 150 having the multiple quantum well structure, the above-described $Ga_{1-y}In_yN$ is employed as the well layer 150b, and $Al_zGa_{1-z}N$ (0≤z<0.3) having a band gap energy larger than that of the well layer 150b is employed as a barrier layer 150a. The well layer 150b and the barrier layer 150a may be doped or not doped with impurities depending upon a design thereof.

It should be noted that, in the exemplary embodiment, the light-emitting layer 150 is configured to output blue light (light emission wavelength of the order of λ=450 nm).

<P-Type Semiconductor Layer>

As shown in FIG. 4, the p-type semiconductor layer 160 is usually configured with the p-cladding layer 160a and the p-contact layer 160b. Further, the p-contact layer 160b can also serve as the p-cladding layer 160a.

The p-cladding layer 160a performs confinement of carriers within the light-emitting layer 150 and injection of carriers. The p-cladding layer 160a is not particularly limited as long as the band gap energy of the composition thereof is larger than that of the light-emitting layer 150 and carriers can be confined within the light-emitting layer 150, but is preferably composed of $Al_xGa_{1-x}N$ (0<x≤0.4).

It is preferable that the p-cladding layer 160a is composed of such AlGaN in terms of confinement of carriers within the light-emitting layer 150. The thickness of the p-cladding layer 160a is not particularly limited, but preferably 1 nm to 400 nm, and more preferably 5 nm to 100 nm.

The p-type impurity concentration of the p-cladding layer 160a is preferably $1 \times 10^{18}/cm^3$ to $1 \times 10^{21}/cm^3$, and more preferably $1 \times 10^{19}/cm^3$ to $1 \times 10^{20}/cm^3$. If the p-type impurity concentration is in the above ranges, excellent p-type crystals can be obtained without deteriorating crystallinity.

Further, the p-cladding layer 160a may have a superlattice structure in which the layer is laminated plural times of these structures, and preferably has an alternating structure of AlGaN and AlGaN or an alternating structure of AlGaN and GaN.

The p-contact layer 160b is a layer for providing the first electrode 200. The p-contact layer 160b is preferably composed of $Al_xGa_{1-x}N$ ($0 \leq x \leq 0.4$). It is preferable that Al composition is in the above-described range in terms of allowing to maintain excellent crystallinity and good ohmic contact with the first electrode 200.

It is preferable to contain p-type impurities in a concentration of $1 \times 10^{18}/cm^3$ to $1 \times 10^{21}/cm^3$, and preferably $5 \times 10^{19}/cm^3$ to $5 \times 10^{20}/cm^3$ in terms of maintaining good ohmic contact, suppressing cracking and maintaining excellent crystallinity. The p-type impurities are not particularly limited, but, for example, Mg is preferably provided.

The thickness of the p-contact layer 160b is not particularly limited, but is preferably 10 nm to 500 nm, and more preferably 50 nm to 200 nm. It is preferable to provide the thickness of the p-contact layer 160b in these ranges in terms of light emission output.

<First Electrode>

As shown in FIG. 2, the first electrode 200 is laminated on the top surface 160c of the p-type semiconductor layer 160. As shown in FIG. 3, in a planar view, the first electrode 200 (refer to FIG. 2) is formed to cover almost of all of the top surface 160c of the p-type semiconductor layer 160, except for a part that has been removed by etching or the like so as to form the second electrode 300.

Figure 5:
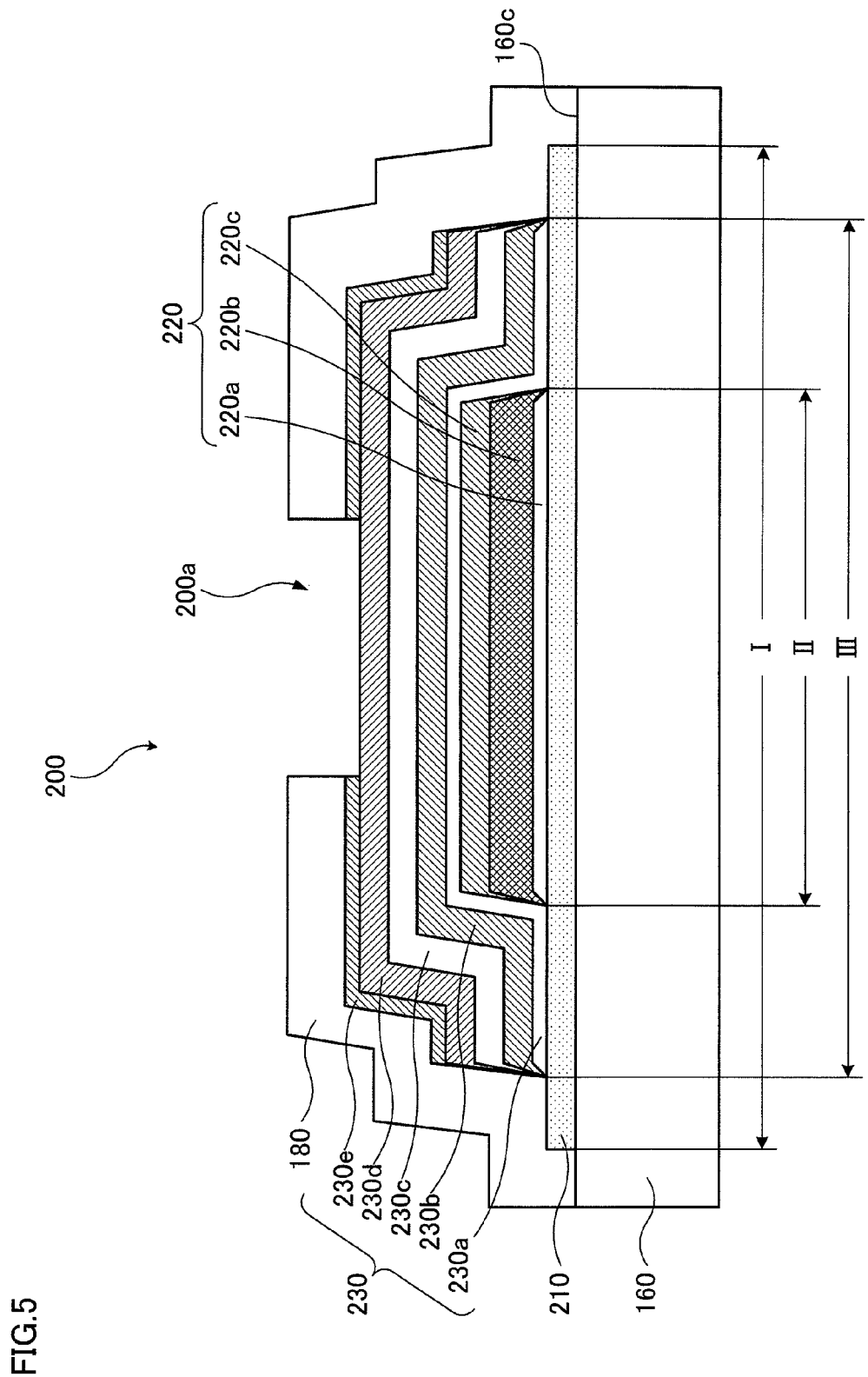
FIG. 5 is a diagram showing an example of a cross-sectional schematic configuration diagram of a first electrode.

FIG. 5 is a diagram showing an example of a cross-sectional schematic configuration diagram of the first electrode 200. The first electrode 200 includes: a first transparent electrode layer 210; a reflecting section 220 that reflects the light emitted from the light-emitting layer 150; and an overcoat section 230 provided to cover the first transparent electrode layer 210 and the reflecting section 220. The reflecting section 220 includes: a second transparent electrode layer 220a; a reflecting layer 220b; and a first barrier layer 220c. The overcoat section 230 includes: a first bonding layer 230a; a second barrier layer 230b; a first metal layer 230c; a second metal layer 230d; and a second bonding layer 230e.

Hereinafter, descriptions will be given in order.

<First Transparent Electrode Layer>

It is preferable that the first transparent electrode layer 210 has transparency to the light emitted from the light-emitting layer 150. Further, for uniformly passing a current over the entire surface of the p-type semiconductor layer 160, it is preferable to use the first transparent electrode layer 210 having excellent conductivity and narrow resistance distribution.

The first transparent electrode layer 210 is provided to prevent elements of the reflecting layer 220b, which will be described later, from moving (migrating) into the laminated semiconductor layer 100.

It is preferable that the first transparent electrode layer 210 can obtain an ohmic contact with the p-type semiconductor layer 160 and has small contact resistance. Consequently, it is preferable that the first transparent electrode layer 210 is crystalline.

As an example of the first transparent electrode layer 210, an oxide conductive material having excellent optical transparency to the light of a wavelength emitted from the light-emitting layer 150 is used. In particular, an oxide conductive material containing any one of In (indium) and Ti (titanium) is used. A part of oxides containing In or Ti is preferable in the point that both optical transparency and conductivity thereof are superior to other transparent conductive films. Examples of conductive oxides containing In include: IZO (indium zinc oxide ($In_2O_3$—ZnO)); ITO (indium tin oxide ($In_2O_3$—$SnO_2$)); IGO (indium gallium oxide ($In_2O_3$—$Ga_2O_3$)); and ICO (indium cerium oxide ($In_2O_3$—$CeO_2$)). It should be noted that a dopant such as fluorine may be added to these materials. Further, examples of conductive oxides containing Ti include titanium oxide or the like, and titanium oxide added with niobium (Nb) is exemplified.

As described above, it is preferable that the first transparent electrode layer 210 is crystalline. The first transparent electrode layer 210 may be crystallized by performing thermal annealing.

The first transparent electrode layer 210 can be formed by providing these materials by any well-known method in this technical field.

In the exemplary embodiment, as the first transparent electrode layer 210, a transparent material containing $In_2O_3$ crystals having a crystal structure of a hexagonal system or a bixbyite structure (for example, ITO or IZO) can be preferably used.

For instance, in the case where IZO containing $In_2O_3$ crystals having a crystal structure of a hexagonal system is used as the first transparent electrode layer 210, an amorphous (non-crystalline) IZO film that has an excellent etching property can be used and processed into a specific shape, and thereafter, processed into the first transparent electrode layer 210 that is crystalline by transferring the amorphous state into a structure containing crystals through a heat treatment or the like.

Further, as the IZO film used for the first transparent electrode layer 210, it is preferable to employ a composition showing the lowest specific resistance.

For example, a ZnO concentration in IZO is preferably 1% by mass to 20% by mass, and more preferably in a range of 5% by mass to 15% by mass. 10% by mass is especially preferred. Moreover, the thickness of the IZO film is preferably in a range of 5 nm to 500 nm so as not to absorb the light emitted from the light-emitting layer 150.

The IZO film used as the first transparent electrode layer 210 is, as an example, processed into the shape of the pattern I shown in FIGS. 3 and 5. It is preferable to perform the patterning prior to a heat treatment described later. Since the IZO film in the amorphous state is changed into the crystallized IZO film by a heat treatment, it becomes difficult to apply etching thereto compared to the IZO film in the amorphous state. In contrast, the IZO film prior to the heat treatment is in the amorphous state, and thereby it is possible to apply etching thereto with ease and good accuracy by use of a known etchant (ITO-07N etchant manufactured by KANTO CHEMICAL CO., INC).

Etching for the IZO film in the amorphous state may be performed by using a dry-etching apparatus. On that occasion, $Cl_2$, $SiCl_4$, $BCl_3$ or the like can be used as an etching gas. The IZO film in the amorphous state can be changed into an IZO film containing $In_2O_3$ crystals having a crystal structure of a hexagonal system or an IZO film containing $In_2O_3$ crystals having a bixbyite structure by performing a heat treatment of, for example, 500° C. to 1000° C. and controlling the conditions. Since it is difficult to apply etching to the IZO film containing $In_2O_3$ crystals having a crystal structure of a hexagonal system as described above, the heat treatment is preferably performed after the aforementioned etching process.

The heat treatment of the IZO film used for the first transparent electrode layer 210 is desirably performed in an atmosphere not containing $O_2$, and as the atmosphere not containing $O_2$, an inert gas atmosphere such as $N_2$ atmosphere or a mixed gas atmosphere of $H_2$ and an inert gas such as $N_2$ can be provided, and accordingly, the $N_2$ atmosphere or the mixed gas atmosphere of $N_2$ and $H_2$ is desirable. It should be noted that, if the heat treatment of the IZO film is performed in the $N_2$ atmosphere or the mixed gas atmosphere of $N_2$ and $H_2$, it is possible to, for example, crystallize the IZO film into a film containing $In_2O_3$ crystals having a crystal structure of a hexagonal system and effectively reduce a sheet resistance of the IZO film.

Further, the heat treatment temperature of the IZO film is preferably 500° C. to 1000° C. If the heat treatment is performed at a temperature less than 500° C., a possibility occurs that the IZO film cannot be crystallized sufficiently, thus, in some cases optical transparency of the IZO film is not sufficiently high. If the heat treatment is performed at a temperature more than 1000° C., the IZO film is crystallized but sometimes the optical transparency of the IZO film is not sufficiently high. Further, if the heat treatment is performed at a temperature more than 1000° C., there is a possibility of deteriorating the semiconductor layer provided below the IZO film.

In the case of crystallizing the IZO film in an amorphous state, differences in layer forming conditions or heat treatment conditions result in a difference in a crystal structure of the IZO film. However, in the exemplary embodiment according to the present invention, the first transparent electrode layer 210 may be, particularly in the case of crystalline IZO, IZO containing $In_2O_3$ crystals having a bixbyite crystal structure or IZO containing $In_2O_3$ crystals having a crystal structure of a hexagonal system. Particularly, IZO containing $In_2O_3$ crystals having a crystal structure of a hexagonal system is preferred.

Especially, as described above, the IZO film crystallized by the heat treatment shows better adhesiveness to the p-type semiconductor 160 and availability of good ohmic contact than those of the IZO film in an amorphous state, thus being very effective in the exemplary embodiment according to the present invention. Moreover, since the resistance is reduced in the IZO film crystallized by the heat treatment compared to that in the IZO film in an amorphous state, the IZO film crystallized by the heat treatment is preferred in the point that the forward voltage Vf can be reduced when the semiconductor light-emitting element 10 is configured.

<Reflecting Section>

Next, configuration of the reflecting section 220 will be described. The reflecting section 220 includes: the second transparent electrode layer 220a; the reflecting layer 220b; and the first barrier layer 220c. As will be described later, these layers are a group of layers successively formed.

It is preferable that the second transparent electrode layer 220a can obtain ohmic contact with each of the first transparent electrode layer 210 and the reflecting layer 220b and has small contact resistance. In addition, it is preferable that the second transparent electrode layer 220a has transparency to the light emitted from the light-emitting layer 150.

It is preferable that the reflecting layer 220b indicates excellent reflective characteristics to the light emitted from the light-emitting layer 150.

<Second Transparent Electrode Layer>

The second transparent electrode layer 220a is a layer for ensuring adhesiveness between the first transparent electrode layer 210 and the reflecting layer 220b. In other words, if the first transparent electrode layer 210 is crystallized by the heat treatment, there is a possibility that the reflecting layer 220b described later is not deposited but is delaminated. Accordingly, it is preferable that the second transparent electrode layer 220a is non-crystalline (amorphous). Consequently, it is preferable to form the second transparent electrode layer 220a after crystallizing the first transparent electrode layer 210 by the heat treatment or the like. This is because, if the second transparent electrode layer 220a is laminated subsequent to the first transparent electrode layer 210 and then the heat treatment is carried out for crystallizing the first transparent electrode layer 210, there is a possibility that the second transparent electrode layer 220a is also crystallized.

In the exemplary embodiment, similar to the first transparent electrode layer 210, a transparent material containing $In_2O_3$ crystals (such as IZO, ITO and the like) can be preferably used as the second transparent electrode layer 220a.

Further, in the case where the IZO film is used as the second transparent electrode layer 220a and the IZO film is also used as the first transparent electrode layer 210, a ZnO concentration in IZO may be the same.

For example, the ZnO concentration in IZO is preferably 1% by mass to 20% by mass, and more preferably in a range of 5% by mass to 15% by mass. 10% by mass is especially preferred. Further, the thickness of the IZO film is preferably in a range of 1 nm to 5 nm so as not to absorb the light emitted from the light-emitting layer 150.

In the case of using ITO as the second transparent electrode layer 220a, an $SnO_2$ concentration is used approximately on the same level as the range of concentration of the aforementioned IZO, and the range of the thickness is also on the same level.

The second transparent electrode layer 220a is processed into the shape of the pattern II shown in FIGS. 3 and 5. This patterning may be carried out by a lift-off method. In this case, on the first transparent electrode layer 210, a pattern (not shown) by a resist film with the pattern II as an opening portion is formed. It should be noted that it is preferable to form a wall surface of the resist film of the opening portion into a reverse-tapered shape. Thereafter, on the resist film, the second transparent electrode layer 220a of the IZO film, the reflecting layer 220b of an Ag film described later, and the first barrier layer 220c of a Ta film, which is similarly described later, are successively laminated in this order by a sputtering method or the like. On this occasion, sputtering conditions or the like are set so that the second transparent electrode layer 220a of the IZO film is in the amorphous state.

After that, the IZO film, the Ag film and the Ta film on the resist film with the pattern II as the opening portion are removed together with the resist film to form the second transparent electrode layer 220a, the reflecting layer 220b and the first barrier layer 220c. By doing this way, the central portion of each of the second transparent electrode layer 220a, the reflecting layer 220b and the first barrier layer 220c has a certain thickness and is formed almost flat, whereas, the thickness of the end portion of each layer is gradually reduced and the layers can be formed so that the end portion of a lower layer is covered with the end portion of an upper layer.

[Reflecting Layer]

As the material of the reflecting layer 220b, there is no particular limitation, but the material may indicate excellent reflective characteristics to the light generated by the light-emitting layer 150 of the semiconductor light-emitting element 10. It should be noted that, since the reflecting layer 220b constitutes a part of the first electrode 200, it is preferable that the reflecting layer 220b has excellent conductivity. For these reasons, a metal such as Ag, Al, Ni and the like or a metal alloy containing at least one of them is preferred. Among them, Ag or an alloy containing Ag can be preferably used.

As described above, the Ag film used as the reflecting layer 220b can be provided by any well-known method in this technical field, such as a sputtering method.

Further, the thickness of the Ag film used as the reflecting layer 220b is preferably in a range of 50 nm to 5000 nm so as not to allow the light emitted by the light-emitting layer 150 to pass through. Especially, the thickness is more preferably in a range of 80 nm to 1200 nm. It should be noted that, if the thickness of the reflecting layer 220b is less than 50 nm, there are some cases that are not preferable in terms of deterioration of reflective performance of the light emitted from the light-emitting layer 150.

[First Barrier Layer]

The first barrier layer 220c is a layer for suppressing movement (migration) of elements that form the reflecting layer 220b into the first metal layer 230c of the overcoat section 230, which will be described later, and conversely, migration of elements that form the first metal layer 230c into the reflecting layer 220b.

As the first barrier layer 220c, it is preferable to employ those that can make an ohmic contact with the reflecting layer 220b and has small contact resistance with the reflecting layer 220b. However, the first barrier layer 220b is not required to have a function for transmitting the light from the light-emitting layer 150 in principle, and accordingly, as distinct from the above-described first transparent electrode layer 210, there is no need to have optical transparency. Further, since the first barrier layer 220c has a function for feeding to the p-type semiconductor layer 160 through the reflecting layer 220b and the first transparent electrode layer 210, it is preferable to use those having excellent conductivity and narrow resistance distribution.

The first barrier layer 220c is not particularly limited; however, it may be only necessary for the first barrier layer 220c to suppress migration of the materials of the reflecting layer 220b and the first metal layer 230c that constitutes the overcoat section 230.

In the exemplary embodiment, as the first barrier layer 220c, Ta, Ti, Ni, Nb or W can be used. In particular, Ta can be preferably used. Further, the first barrier layer 220c (for example, the Ta film) can be provided by any well-known method in this technical field, such as the sputtering method.

Moreover, the thickness of the first barrier layer 220c (for example, the Ta film) is preferably in a range of 20 nm to 100 nm. Especially, the thickness is more preferably in a range of 30 nm to 70 nm.

<Overcoat Section>

Next, configuration of the overcoat section 230 will be described.

The overcoat section 230 includes: the first bonding layer 230a; the second barrier layer 230b; the first metal layer 230c; the second metal layer 230d; and the second bonding layer 230e. As will be described later, these layers constitute a group of layers successively formed. Hereinafter, these will be described.

[First Bonding Layer]

The first bonding layer 230a is provided at a lowermost layer, which is a layer for bonding the reflecting section 220 and the overcoat section 230.

As the first bonding layer 230a, there is no particular limitation, but those indicating excellent bonding characteristics with the first barrier layer 220c provided at an uppermost layer of the reflecting section 220 are preferred.

In the case where Ta is used as the first barrier layer 220c as in the exemplary embodiment, Ta, an alloy containing Ta, or a compound of Ta having conductivity is preferred. In particular, TaN (tantalum nitride) can be preferably used.

The thickness of the first bonding layer 230a (for example, the TaN film) is preferably in a range of 1 nm to 50 nm. The first bonding layer 230a can be formed by any well-known method in this technical field.

It should be noted that there may be no first bonding layer 230a if the bonding characteristics between the first barrier layer 220c and the second barrier layer 230b are excellent.

The first bonding layer 230a (for example, the TaN film) is processed into a shape of the pattern III shown in FIGS. 3 and 5. The pattern III is slightly broader than the pattern II, and the first bonding layer 230a is provided to cover the reflecting section 220 that is formed into the shape of the pattern II. This patterning may be performed by the lift-off method. In this case, on the first transparent electrode layer 210, a resist film (not shown) having an opening portion of the pattern III is formed. It should be noted that it is preferable to form a wall surface of the resist film of the opening portion into a reverse-tapered shape. Thereafter, on the resist film, the first bonding layer 230a (for example, the TaN film), and the second barrier layer 230b (for example, the Ta film), the first metal layer 230c (for example, a Pt film), the second metal layer 230b (for example, an Au film) and the second bonding layer (for example, the Ta film), which will be described later, are successively laminated in this order by a sputtering method or the like.

Thereafter, above-described films laminated on the resist film are removed together with the resist film to form the first bonding layer 230a, the second barrier layer 230b, the first metal layer 230c, the second metal layer 230d and the second bonding layer 230e.

By doing this way, as shown in FIG. 5, the central portion of each of the first bonding layer 230a, the second barrier layer 230b, the first metal layer 230c, the second metal layer 230d and the second bonding layer 230e has a certain thickness and is formed almost flat, whereas, the thickness of the end portion of each layer is gradually reduced and the layers can be formed so that the end portion of a lower layer is covered with the end portion of an upper layer.

[Second Barrier Layer]

The second barrier layer 230b is a layer for suppressing migration of elements that form the first metal layer 230c into the reflecting layer 220b, and conversely, migration of elements that form the reflecting layer 220b into the first metal layer 230c. The action of the second barrier layer 230b is similar to that of the first barrier layer 220c. Accordingly, similar to the first barrier layer 220c, Ta, Ti, Ni, Nb or W can be used as the second barrier layer 230b, and in particular, Ta can be preferably used. The second barrier layer 230b (for example, the Ta film) can be provided by any well-known method in this technical field, such as a sputtering method, as described above.

Further, the thickness of the Ta film used as the second barrier layer 220c is preferably in a range of 20 nm to 100 nm. Especially, the thickness is more preferably in a range of 30 nm to 70 nm.

As described above, since the second barrier layer 230b is provided to a range of the pattern III, which is broader than the pattern II, contact between the reflecting layer 220b and the first metal layer 230c described later can be suppressed.

[First Metal Layer]

The first metal layer 230c is provided to improve adhesiveness between the second metal layer 230d of Au or the like, which will be described later, and the second barrier layer 230b.

As the bumps 31 and 34, an Au ball or a solder boll is used. Then, it is preferable that Au or an Au alloy is present on the surface of the first electrode 200 (second metal layer 230d) that is connected to the bump 31. For this reason, in particular, a Pt film can be preferably used as the first metal layer 230c. As described above, the first metal layer 230c (for example, a film of Pt, Hf, Ir, Os, Rh or W) can be provided by any well-known method in this technical field, such as a sputtering method.

Further, the thickness of the first metal layer 230c is preferably in a range of 50 nm to 200 nm. Especially, the thickness is more preferably in a range of 70 nm to 150 nm.

[Second metal layer]

The second metal layer 230d is, as described later, connected to the bump 31. As a material for the second metal layer 230d, Au, Al, Ni, Cu or a metal alloy containing at least one of them is preferred. Among them, Au, Al or a metal alloy containing at least one of them can be preferably used. Since Au and Al are metals having excellent adhesiveness with an Au alloy which is often used as bumps, use of Au, Al or a metal alloy containing at least one of them enables adhesiveness with the bumps to be excellent. Among them, Au or an Au alloy is especially desirable. As described above, the Au film or the like used as the second metal layer 230d can be provided by any well-known method in this technical field, such as a sputtering method.

Further, the thickness of the second metal layer 230d is preferably in a range of 50 nm to 2000 nm. Especially, the thickness is more preferably in a range of 200 nm to 1500 nm.

If the second metal layer 230d is too thin, the adhesiveness with the bump 31 is deteriorated; if too thick, there are no advantages and only the increase in cost is caused. Further, according to the characteristics of the bonding pad, the thicker the second metal layer 230d is, the higher the adhesiveness with the bump 31 becomes, which is preferred. Therefore, it is more preferable that the thickness of the second metal layer 230d is 200 nm or more. Moreover, in terms of the production costs, the thickness is preferably 2000 nm or less.

[Second Bonding Layer]

The second bonding layer 230e is provided for ensuring adhesiveness between the second metal layer 230d and the protecting layer 180.

As described above, if the second metal layer 230d is Au and the protecting layer 180 is $SiO_2$ as in the exemplary embodiment, the adhesiveness between the second metal layer 230d and the protecting layer 180 are poor. To improve bonding characteristics, a metal such as Ta, Ti, Cr, Mo, Ni or W or an alloy containing at least one of them can be preferably used.

Next, the second electrode 300 will be described.

<Second Electrode>

As shown in FIG. 2, the second electrode 300 is formed on the semiconductor layer exposure surface 140c of the n-type semiconductor layer 140. In forming the second electrode 300 in this way, the n-contact layer 140a (refer to FIG. 2) of the n-type semiconductor layer 140 is exposed by cutting and removing a part of the light-emitting layer 150 and the p-type semiconductor layer 160 by a method such as etching, and then the second electrode 300 is formed on the semiconductor layer exposure surface 140c that has been obtained.

Figure 6:
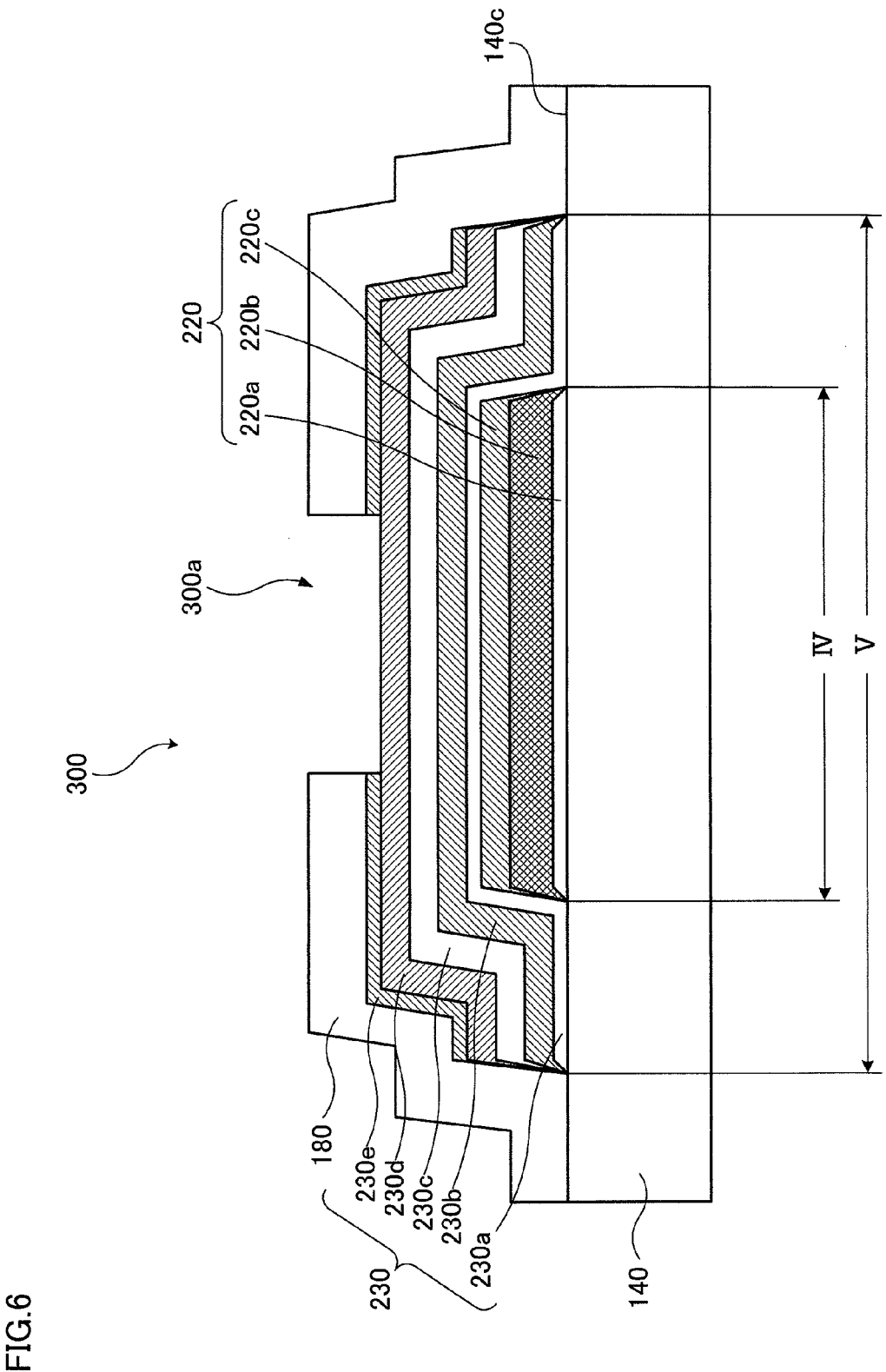
FIG. 6 is a diagram showing an example of a cross-sectional schematic configuration diagram of a second electrode.

FIG. 6 is a diagram showing an example of a cross-sectional schematic configuration diagram of the second electrode 300. The second electrode 300 corresponds to the reflecting section 220 and the overcoat section 230 in the first electrode 200 shown in FIG. 5. In other words, the second electrode 300 has the same configuration as the first electrode 200 except for the first transparent electrode layer 210. Consequently, same symbols are assigned and detailed description is omitted.

In this case, layers in the first electrode 200 and the second electrode 300 provided above the second transparent electrode layer 220a constitute the reflecting section 220 and the overcoat section 230, and have the same configuration. Accordingly, after the first transparent electrode layer 210 is formed, the second electrode 300 can be formed by the same process of the first electrode 200.

Figure 7:
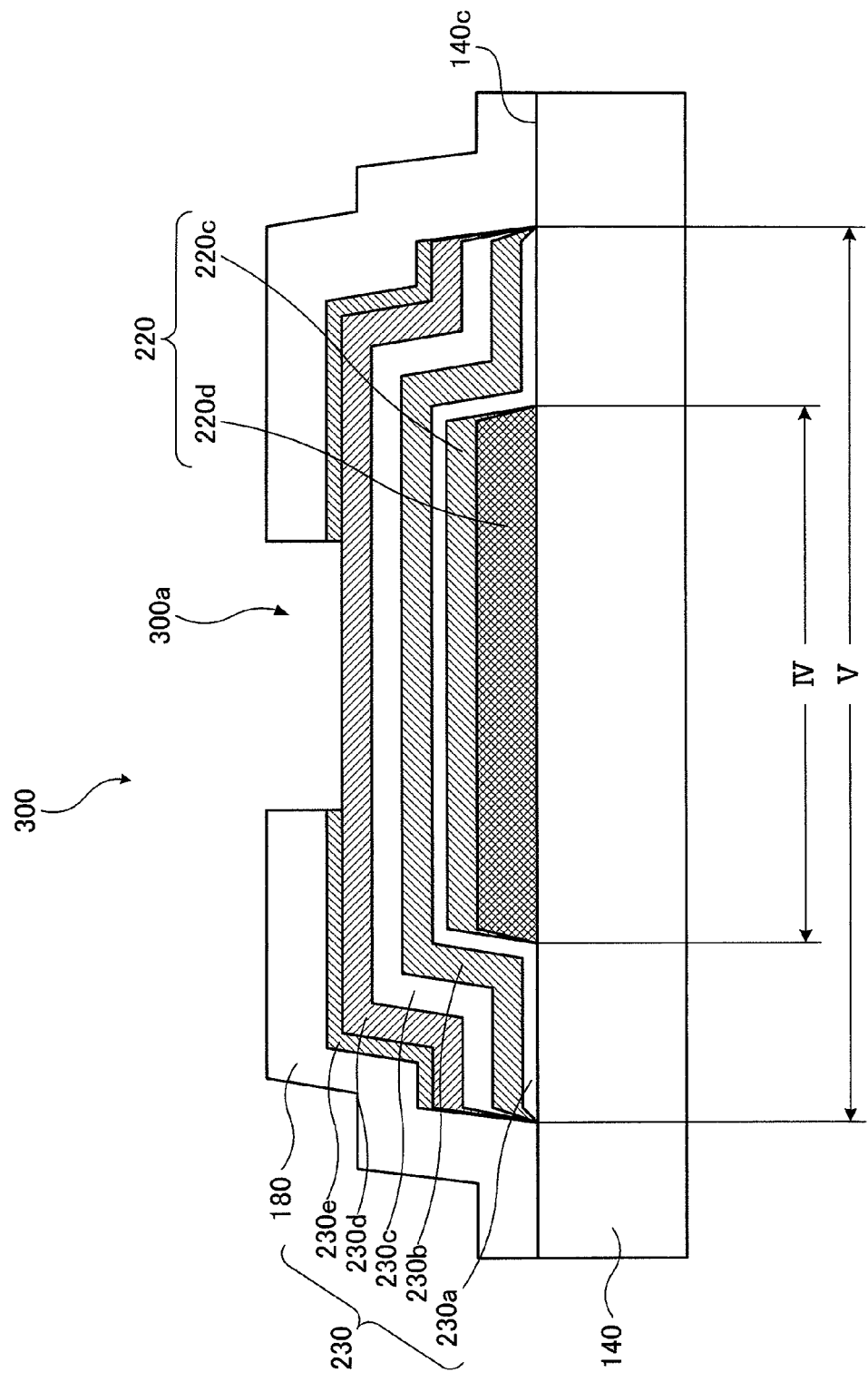
FIG. 7 is a diagram showing an example of a cross-sectional schematic configuration diagram of another configuration of the second electrode.

FIG. 7 is a diagram showing an example of a cross-sectional schematic configuration diagram of another configuration of the second electrode 300. In this second electrode 300, the second transparent electrode layer 220a and the reflecting layer 220b shown in FIG. 6 are replaced with a third metal layer 220d. However, the configuration of the overcoat section 230 is the same as that of the first electrode 200.

It is preferable that the third metal layer 220d can obtain an ohmic contact with the n-type semiconductor layer 140 and has small contact resistance. As the third metal layer 220d, a metal such as Al or Al alloy can be preferably used.

In this case, the first electrode 200 and the second electrode 300 are different except for the overcoat section 230, and therefore, require different processes to be formed. It should be noted that the overcoat section 230 can be formed at the same time.

Of the light emitted from the light-emitting layer 150, the light traveling toward the first electrode 200 is reflected by the reflecting layer 220b and travels toward the substrate 110. However, a part of the light is diffused to travel in a lateral direction or a diagonal direction. Moreover, the light also travels in the direction of the second electrode 300. Consequently, it is preferable that the second electrode 300 includes the reflecting layer 220b, and thereby capable of improving the light extraction efficiency. It should be noted that, even in the case of using the third metal layer 220d, it is preferable to configure the third metal layer 220d with a material having high reflectance to the light emission wavelength.

<Protecting Layer>

Further, in the exemplary embodiment, the protecting layer 180 made of silicon oxide such as $SiO_2$ or nitride such as $Si_3N_4$ may be formed to cover the top surface 160c of the p-type semiconductor layer 160, the top surface of the semiconductor layer exposure surface 140c of the n-type semiconductor layer 140 (including the side wall subjected to etching) and surfaces of the first electrode 200 and the second electrode 300 except for a part thereof (the opening 200a and the opening 300a).

Accordingly, except for the part of the surfaces of the first electrode 200 and the second electrode 300 (the opening 200a and the opening 300a), it is possible to shield the semiconductor light-emitting element 10 to significantly reduce the possibility of entry of external air or water into the semiconductor light-emitting element 10, as well as to contribute to suppressing delamination of the first electrode 200 and the second electrode 300 of the semiconductor light-emitting element 10.

The thickness of the protecting layer 180 is preferably in a range of 50 nm to 1000 nm, more preferably in a range of 100 nm to 500 nm, and still more preferably in a range of 150 nm to 450 nm.

By setting the thickness of the protecting layer 180 to the range of 50 nm to 1000 nm, the possibility of entry of external air or water into the light-emitting layer 150 of the semiconductor light-emitting element 10 is significantly reduced, and thereby delamination of the first electrode 200 and the second electrode 300 of the semiconductor light-emitting element 10 can be suppressed.

In the forming method of the protecting layer 180, for example, in the first place, the protecting layer 180 composed of $SiO_2$ is formed on the top surface 160c of the p-type semiconductor layer 160, the top surface of the semiconductor layer exposure surface 140c of the n-type semiconductor layer 140 (including the side wall subjected to etching) and surfaces of the first electrode 200 and the second electrode 300, and thereafter, a resist not shown in the figure is applied on the protecting layer 180.

Then, the resist on the part of the surfaces of the first electrode 200 and the second electrode 300 (the opening 200a and the opening 300a) is removed and the protecting layer 180 and the second bonding layer 230e are removed by a known etching method to form the opening 200a and the opening 300a on the surface of the second metal layer 230d of each electrode.

The opening 200a of the first electrode 200 can be formed anywhere on the first electrode 200.

Accordingly, for example, the opening 200a of the first electrode 200 may be formed at a position farthest from the opening 300a of the second electrode 300, or formed at a center of the semiconductor light-emitting element 10. However, it is not preferable to form the opening 200a at a position too close to the opening 300a of the second electrode 300 because a short is caused between the bumps 31 and 34.

Further, the work of the flip-chip bonding can be conducted easier if the opening 200a of the first electrode 200 is larger as an area; however, it is preferable that the opening 200a is of the extent slightly larger than the diameter of the bump 31. For example, it is preferable to form the opening 200a as a circle with a diameter of the order of 100 μm, but not necessarily be a circle. The same is true on the opening 300a of the second electrode 300.

Next, description will be given to an example of a method for producing the semiconductor light-emitting device 1 shown in FIG. 1. Incidentally, suppose that, in the second electrode 300 as a negative electrode, the reflecting section 220 and the overcoat section 230 employ the same configuration (the configuration shown in FIG. 6) as that of the first electrode 200.

(Method for Producing Semiconductor Light-Emitting Element)

First, a method for producing the semiconductor light-emitting element 10 in the exemplary embodiment will be described.

The semiconductor light-emitting element 10 includes: an intermediate layer forming process in which the intermediate layer 120 is formed on the substrate 110; a base layer forming process in which the base layer 130 is formed; a process for forming the laminated semiconductor layer 100 including the light-emitting layer 150; a process for forming the semiconductor layer exposure surface 140c by cutting out a part of the laminated semiconductor layer 100; and an electrode forming process in which the first electrode 200 is formed and the second electrode 300 is formed on the semiconductor layer exposure surface 140c.

Here, the process for forming the laminated semiconductor layer 100 including the light-emitting layer 150 includes: an n-type semiconductor layer forming process in which the n-type semiconductor layer 140 is formed; a light-emitting layer forming process in which the light-emitting layer 150 is formed; and a p-type semiconductor layer forming process in which the p-type semiconductor layer 160 is formed.

In some cases, the method for producing the semiconductor light-emitting element 10, to which the exemplary embodiment is applied, includes an annealing process after the electrode forming process, in which heat treatment is applied to the semiconductor light-emitting element 10 that has been obtained, as necessary.

Hereafter, each process will be described in turn.

<Intermediate Layer Forming Process>

First, the substrate 110 is subjected to preprocessing for forming the intermediate layer 120. The preprocessing can be performed by a method of, for example, placing the substrate 110 in a chamber of a sputtering device and conducting sputtering before forming the intermediate layer 120. Specifically, preprocessing for cleaning the top surface of the substrate 110 by exposing thereof in plasma of Ar or $N_2$ may be performed. Organic substances or oxides adhered to the top surface of the substrate 110 can be removed by the action of plasma of Ar gas or $N_2$ gas on the substrate 110.

Next, on the top surface of the substrate 110, the intermediate layer 120 is laminated by the sputtering method.

In the case of forming the intermediate layer 120 having a single crystal structure by the sputtering method, as for the ratio of a flow rate of nitrogen to a flow rate of nitrogen materials and inert gases in the chamber, the nitrogen materials desirably account for 50 vol % to 100 vol %.

Further, in the case of forming the intermediate layer 120 having columnar crystals (polycrystals) by the sputtering method, as for the ratio of the flow rate of nitrogen to the flow rate of nitrogen materials and inert gases in the chamber, the nitrogen materials desirably account for 1 vol % to 50 vol %. It should be noted that the intermediate layer 120 can be formed not only by the sputtering method, but also by the MOCVD method.

<Base Layer Forming Process>

Next, after forming the intermediate layer 120, the base layer 130 of a single crystal is formed on the top surface of the substrate 110 on which the intermediate layer 120 has been formed. The base layer 130 may be formed by the sputtering method or the MOCVD method.

<Laminated Semiconductor Layer Forming Process>

The laminated semiconductor layer forming process includes the n-type semiconductor layer forming process, the light-emitting layer forming process and the p-type semiconductor layer forming process.

<N-Type Semiconductor Layer Forming Process>

After forming the base layer 130, the n-type semiconductor layer 140 is formed by laminating the n-contact layer 140a and the n-cladding layer 140b. The n-contact layer 140a and the n-cladding layer 140b may be formed by the sputtering method or the MOCVD method.

<Light-Emitting Layer Forming Process>

Formation of the light-emitting layer 150 may be performed by either method of sputtering or MOCVD, but especially, the MOCVD method is preferred. Specifically, the barrier layers 150a and the well layers 150b may be alternately and repeatedly laminated such that the barrier layers 150a are located to face the n-type semiconductor layer 140 and the p-type semiconductor layer 160.

<P-Type Semiconductor Layer Forming Process>

Further, formation of the p-type semiconductor layer 160 may be performed by either method of sputtering or MOCVD. Specifically, the p-cladding layers 160a and the p-contact layers 160b may be laminated in turn.

<First Transparent Electrode Layer Forming Process>

The first transparent electrode layer 210 is formed by known methods of film formation by the sputtering method or the like, resist pattern formation corresponding to the pattern I in FIGS. 3 and 5 by photolithography or the like and subsequent etching.

<Semiconductor Layer Exposure Surface Forming Process>

The semiconductor layer exposure surface 140c is formed by etching a part of the laminated semiconductor layer 100, and exposing a part of the n-contact layer 140a.

<Heat Treatment Process>

Then, under the reducing atmosphere such as nitrogen, heat treatment is performed in a range of 500° C. to 1000° C. This heat treatment is performed for crystallizing the first transparent electrode layer 210 and increasing the bonding characteristics between the p-type semiconductor layer 160 and the first transparent electrode layer 210.

<First Electrode and Second Electrode Forming Process>

Next, a resist film having an opening of the pattern II shown in FIGS. 3 and 5 on the first transparent electrode layer 210 and an opening of the pattern IV shown in FIGS. 3 and 6 on the semiconductor layer exposure surface 140c is formed. Then the second transparent electrode layer 220a, reflecting layer 220b, and the first barrier layer 220c are formed by the sputtering method or the like in this order (each process is referred to as the second transparent electrode layer forming process, the reflecting layer forming process and the first barrier forming process). It should be noted that it is preferable to continuously form the second transparent electrode layer 220a, the reflecting layer 220b and the first barrier layer 220c without breaking a vacuum state in terms of adhesiveness or contamination, and thereby capable of reducing the time for film formation.

Thereafter, the resist film and materials deposited thereon, which are same as the second transparent electrode layer 220a, the reflecting layer 220b and the first barrier layer 220c, are delaminated and removed by being immersed in a resist removal solution.

Similarly, a resist film having an opening of the pattern III shown in FIGS. 3 and 5 on the first transparent electrode layer 210 and an opening of the pattern V shown in FIGS. 3 and 6 on the semiconductor layer exposure surface 140c is formed. Then the first bonding layer 230a, the second barrier layer 230b, the first metal layer 230c, the second metal layer 230d and the second bonding layer 230e are continuously formed by the sputtering method or the like. It should be noted that it is preferable to continuously form the first bonding layer 230a, the second barrier layer 230b, the first metal layer 230c, the second metal layer 230d and the second bonding layer 230e without breaking a vacuum state in terms of adhesiveness or contamination, and thereby capable of reducing the time for film formation.

Thereafter, the resist film and materials deposited thereon, which are same as the first bonding layer 230a, the second barrier layer 230b, the first metal layer 230c, the second metal layer 230d and the second bonding layer 230e, are delaminated and removed by being immersed in a resist removal solution (an overcoat section forming process).

It should be noted that, in forming the layers by the sputtering method or the like as described above, sputtering conditions are set so that the second transparent electrode layer 220a is in the amorphous state.

Finally, the protecting layer 180 is formed to cover the surfaces side faces of the intermediate layer 120, the base layer 130, the laminated semiconductor layer 100, the semiconductor layer exposure surface 140c, the first electrode 200 and the second electrode 300, and thereafter, a resist not shown in the figure is applied on the protecting layer 180.

Then, to be connected to the bumps 31 and 34, the protecting layer 180 and the second bonding layer 230e corresponding to the part of the opening 200a and the opening 300a are removed by RIE (reactive ion etching) or the like to expose the surface of the second metal layer 230d of the first electrode 200 and the second electrode 300.

In the exemplary embodiment, the reflecting section 220 and the overcoat section 230 in the first electrode 200 and the second electrode 300 have the same configuration, and accordingly, productivity of the semiconductor light-emitting element 10 is improved.

(Method for Producing Submount)

Next, the method for producing the submount 15 will be described.

The submount substrate 20 of ceramic or the like is prepared, and the submount wirings 21 and 24 made of Ag or Au are formed by the lift-off method or the like. Then, except for the parts that connect to the first electrode 200 and the second electrode 300 of the semiconductor light-emitting element 10, namely, the parts on which the bumps 31 and 34 are formed, the surface of the submount substrate 20 is covered with a protecting film made of $SiO_2$ by the lift-off method or the like. Finally, the ball-shaped bumps 31 and 34 made of an Au—Sn alloy are provided.

(Method for Producing Semiconductor Light-Emitting Device)

Lastly, the method for producing the semiconductor light-emitting device 1 will be described.

The semiconductor light-emitting element 10 is arranged face down on the submount 15, and the semiconductor light-emitting element 10 and the submount 15 are aligned so that the bumps 31 and 34 on the submount 15 and the first electrode 200 and the second electrode 300 of the semiconductor light-emitting element 10 correspond to each other based on the predetermined connective relationship (alignment process).

After that, the semiconductor light-emitting element 10 is pressed (fixed by pressure) against the submount 15 while being heated at 300° C. (heating and pressing process). Consequently, the bumps 31 and 34 are electrically connected to the first electrode 200 and the second electrode 300, respectively.

In this manner, the semiconductor light-emitting device 1 is completed.

By the way, in the exemplary embodiment, the first transparent electrode layer 210, which is crystalline, and the second transparent electrode layer 220a, which is amorphous (non-crystalline), are laminated in the first electrode 200 provided on the p-type semiconductor layer 160.

The reason why the first transparent electrode layer 210 is made to be crystalline is to improve the adhesiveness (bonding characteristics) between the p-type GaN layer, which is the p-type semiconductor layer 160, and the first transparent electrode layer 210 (for example, the IZO film), as will be described later. For example, in the case where the IZO is not crystallized, the forward voltage Vf becomes high compared to the case of crystallizing.

The reason why the second transparent electrode layer 220a, which is amorphous, is provided is that, when the reflecting layer 220b (for example, the Ag film) is formed on a crystallized film (IZO film), which is the first transparent electrode layer 210, the reflecting layer 220b (Ag film) is delaminated from the first transparent electrode layer 210 (IZO film). The reflecting layer 220b (Ag film) and the crystallized first transparent electrode layer 210 (IZO film) have inferior adhesiveness.

On the other hand, the second transparent electrode layer 220a, which is amorphous (for example, an amorphous IZO film), and the reflecting layer 220b (Ag film) have excellent adhesiveness (bonding characteristics). Further, first transparent electrode layer 210 and the second transparent electrode layer 220a, which is amorphous (non-crystalline), have excellent adhesiveness (bonding characteristics) and excellent conductivity. Accordingly, in the exemplary embodiment, the crystalline IZO film is formed as the first transparent electrode layer 210 on the p-type semiconductor layer 160, and further, the amorphous IZO film is laminated as the second transparent electrode layer 220a, then the reflecting layer 220b made of the Ag film is provided thereon.

Figure 8:
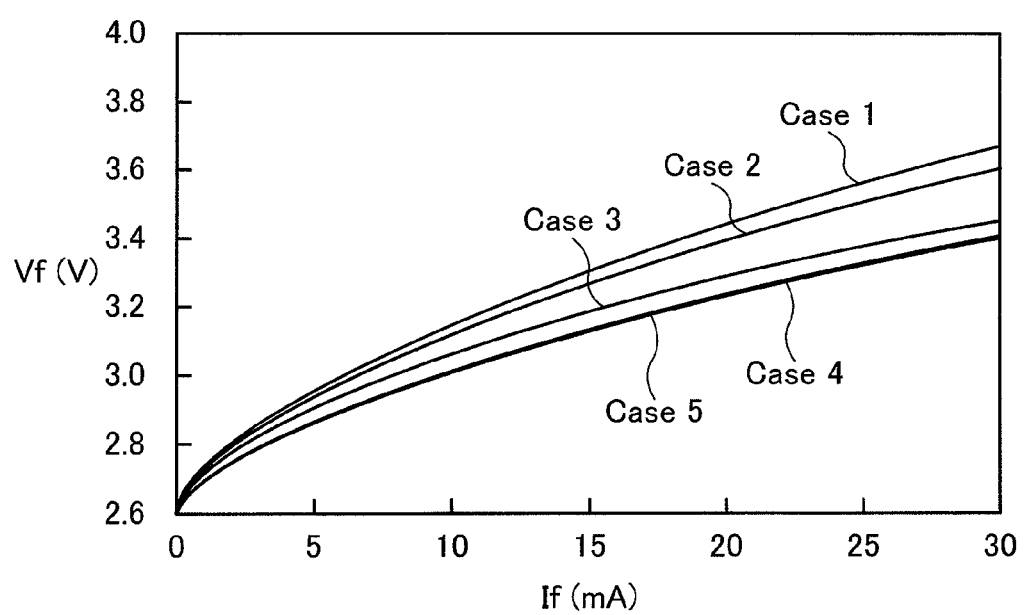
FIG. 8 is a diagram showing bonding characteristics between a p-type GaN layer (p-type semiconductor layer) and an IZO film (or Pt film)

FIG. 8 is a diagram showing bonding characteristics between the p-type GaN layer (p-type semiconductor layer 160) and the IZO film (or the Pt film).

Here, in the semiconductor light-emitting element 10 that is produced without providing the second transparent electrode layer 220a, forward current If—forward voltage Vf characteristics were evaluated. Table 1 indicates parameters regarding Cases 1 to 5 shown in FIG. 8. Case 1 shows the characteristics in the case where IZO of the first transparent electrode layer 210 is replaced with Pt. Cases 2 to 5 indicate the difference in the state depending on the thickness and presence or absence of the heat treatment providing that the first transparent electrode layer 210 is the IZO film.

TABLE 1

|  | Material | Thickness (nm) | State |
| --- | --- | --- | --- |
| Case 1 | Pt | 5 |  |
| Case 2 | IZO | 2 | Amorphous |
| Case 3 | IZO | 5 | Amorphous |
| Case 4 | IZO | 5 | Crystalline (Heat treatment) |
| Case 5 | IZO | 10 | Crystalline (Heat treatment) |

As shown in FIG. 8, in the case of using the Pt film of Case 1, the forward voltage Vf in the case where the forward current If is constant becomes high compared to Cases 2 to 5 where the IZO film is used. In other words, the forward voltage Vf of the IZO film is lower than that of the Pt film, and therefore the IZO film is excellent in the bonding characteristics with the p-type semiconductor layer 160.

Cases 2 and 3 show the case of the amorphous IZO film. In Case 2, the thickness of the IZO film is 2 nm, and in Case 3, the thickness of the IZO film is 5 nm. In Case 3, the forward voltage Vf is lower. It can be understood that the thicker (5 nm) IZO film is preferred.

Cases 4 and 5 show the case of the IZO film that has been subjected to heat treatment. In Case 4, the thickness of the IZO film is 5 nm, and in Case 5, the thickness of the IZO film is 10 nm. In FIG. 8, little difference can be shown between them and they are overlapping. In other words, since the forward voltage Vf is substantially the same in Cases 4 and 5, it can be understood that the thickness of the IZO film may be 5 nm or more.

Cases 3 and 4 show the case where the thickness of the IZO film is 5 nm; Case 3 indicates the case of amorphous film, whereas Case 4 indicates the case of heat treatment (crystalline). When these are compared, in the case of the crystalline IZO film, the forward voltage Vf is low compared to the case of amorphous film.

From above, it is preferable to form the crystalline IZO film having a thickness of 5 nm or more on the p-type semiconductor layer 160, which is p-type GaN.

EXAMPLES

Next, examples of the present invention will be described, but the present invention is not limited to the examples.

Examples 1 to 6

The semiconductor light-emitting element 10 used in Examples 1 to 6 has the same configuration as that shown in FIG. 2. The first electrode 200 has the same configuration as that shown in FIG. 5. The second electrode 300 has the same configuration as that shown in FIG. 6.

The substrate 110 is a sapphire substrate which is C-axis oriented. In Examples 1 to 6, the first transparent electrode layer 210 is the IZO film or the ITO film subjected to heat treatment. The thickness thereof differs in the examples 1 to 6. The second transparent electrode layer 220a is the amorphous IZO film with a thickness of 2 nm. The reflecting layer 220b is made of Ag, the first barrier layer 220c is made of Ta, the first bonding layer 230a is made of TaN, the second barrier layer 230b is made of Ta, the first metal layer 230c is made of Pt, the second metal layer 230d is made of Au and the second bonding layer 230e is made of Ta.

Comparative Example

On the other hand, Comparative example is configured similar to Example 4 except that the second transparent electrode layer 220a (amorphous IZO film) in Example 4 is not formed.

Table 2 indicates the evaluation results regarding Examples 1 to 6 and Comparative example. The evaluation items are: the forward voltage Vf for the forward current If of 20 mA; the light emission wavelength λ; the light emission output Po; and the result of delamination test of the reflecting layer. It should be noted that the light emission wavelength λ is a wavelength at a peak of the light emission intensity (peak wavelength).

The delamination test of the reflecting layer 220b from the first transparent electrode layer 210 was performed based on a known tape delamination test (tape test) upon depositing: the first transparent electrode layer 210 described in Table 2 (material and thickness) on a p-type GaN layer (p-type semiconductor layer 160) prepared separately from the formation of the light-emitting element shown in FIG. 2; the second transparent electrode layer 220a (except for Comparative example) on the first transparent electrode layer 210, the thickness thereof being the same; and the reflecting layer 220b on the second transparent electrode layer 220a, the thickness thereof being the same. In the delamination test, 10 pieces of same test electrodes were prepared, and the case where one or more pieces are delaminated was represented as "X", whereas the case where no delamination occurs was represented as "O".

TABLE 2

| | First transparent electrode layer | | Bump formation Submount side/ Semiconductor light-emitting element side | Forward voltage Vf (V) | Evaluation | | |
|---|---|---|---|---|---|---|---|
| | Material | Thickness (nm) | | | Light emission wavelength λ (nm) | Light emission output Po (mW) | Delamination test of reflecting layer |
| Example 1 | IZO | 5 | Submount side | 3.2 | 452 | 20.7 | ○ |
| Example 2 | IZO | 10 | Submount side | 3.2 | 451 | 20.4 | ○ |
| Example 3 | ITO | 20 | Submount side | 3.2 | 452 | 21.4 | ○ |
| Example 4 | IZO | 50 | Submount side | 3.2 | 451 | 22.9 | ○ |
| Example 5 | IZO | 300 | Submount side | 3.2 | 450 | 20.8 | ○ |
| Example 6 | IZO | 50 | Semiconductor light-emitting element side | 3.2 | 451 | 23.0 | ○ |
| Comparative example | IZO | 50 | Submount side | 3.2 | 451 | 22.8 | X |

As shown in Examples 1, 2, 4 and 5, in the range of thickness of the IZO film of the first transparent electrode layer 210 from 5 nm to 300 nm, the light emission output Po indicates 22.9 mW at the maximum for the thickness of the IZO film of 50 nm, and is slightly decreased in the case where the thickness of the IZO film is smaller or larger than this value. However, the difference among these values is small.

On the other hand, as shown in Comparative example in Table 2, in the case where the second transparent electrode layer 220a is not formed on the first transparent electrode layer 210, delamination easily occurred in the delamination test.

It should be noted that, in the Examples 1 to 6 and the Comparative example, the light emission wavelength λ is 450 nm to 452 nm, where there exists little difference. This is thought to be due to the same configuration of the laminated semiconductor layer 100.

From above, by forming the first transparent electrode layer 210 with the crystalline IZO (or ITO) and forming the second transparent electrode layer 220a with the amorphous IZO, the semiconductor light-emitting element 10, in which the forward voltage Vf is low, the light emission output is large, and no electrode delamination occurs, can be obtained.

Figure 9:
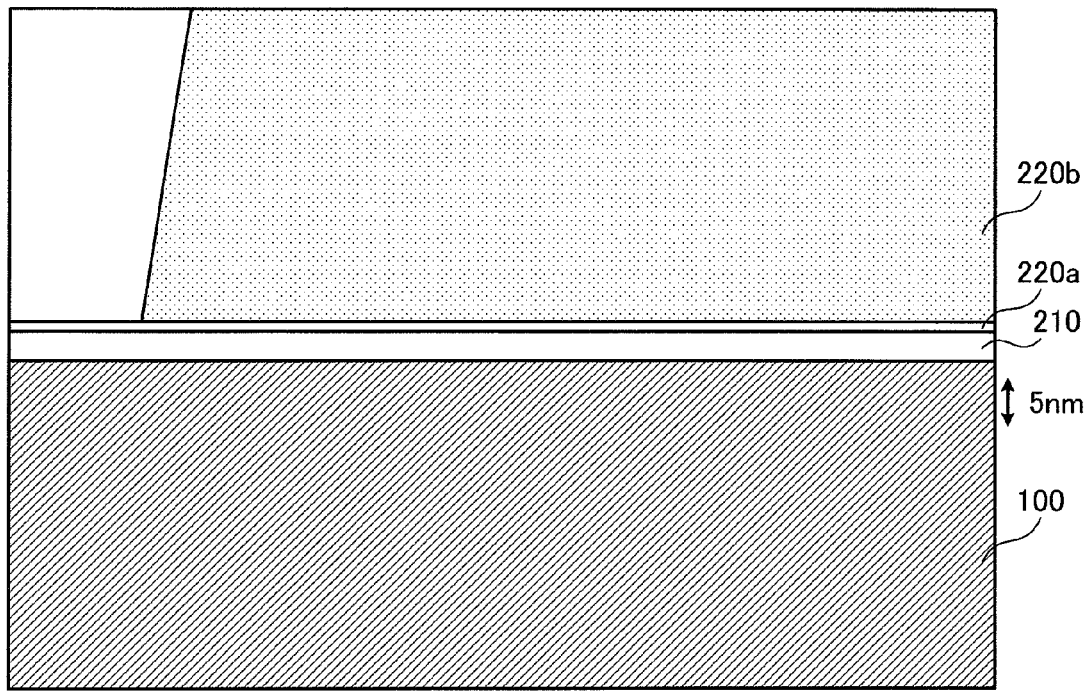
FIG. 9 is a schematic configuration diagram showing a result of observation through a transmission electron microscope (TEM) of a cross section of crystalline IZO and amorphous IZO laminated on the laminated semiconductor layer.

FIG. 9 is a schematic diagram showing a result of observation through a transmission electron microscope (TEM) of a cross section of crystalline IZO film (first transparent electrode layer 210) and amorphous IZO film (second transparent electrode layer 220a) laminated on the laminated semiconductor layer 100.

Specifically, the crystalline IZO film having a thickness of 5 nm (first transparent electrode layer 210) is formed on the laminated semiconductor layer 100, the amorphous IZO film having a thickness of 2 nm (second transparent electrode layer 220a) is further laminated thereon, and still further, the reflecting layer 220b made of an Au alloy is provided thereon. In the TEM image, the two-layer structure of the crystalline IZO film and the amorphous IZO film was able to be distinctively observed.

In the exemplary embodiment, the first transparent electrode layer 210, which is crystalline, and the second transparent electrode layer 220a, which is amorphous (non-crystalline), are used. Here, suppose that "crystalline" includes the case where the forward voltage Vf is reduced by applying heat treatment in addition to the state of crystallographically single crystal or polycrystal such as a case where a peak is observed in the X ray diffraction or electron diffraction. On the other hand, "non-crystalline" includes the case where external heating in film formation or temperature rise in film formation is suppressed, or the case where energy of particles involved in film formation is kept low in addition to the state of crystallographically amorphous (non-crystalline) such as a case where a halo is observed in the X ray diffraction or electron diffraction.

It should be noted that, in the exemplary embodiment, the semiconductor light-emitting element 10, whose light emission peak wavelength λd is close to 450 nm, is described, but the subject to which the present invention is applied is not limited thereto.

For example, it is obvious that the present invention can be applied to a semiconductor light-emitting element 10 that emits light of infrared to red, whose light-emitting layer is made of a compound semiconductor, such as $Ga_{1-x}Al_xAs$ ($0<x<1$), $GaAs_{1-x}P_x$ ($0<x<1$) or $In_{1-x}Ga_xP$ ($0<x<1$), or a semiconductor light-emitting element 10 that emits light of orange to green, in which AlP, AlAs, GaP or the like is used for the light-emitting layer.

Further, as a subject to which the semiconductor light-emitting device 1 according to the present invention can be applied, for example, an electronic apparatus such as a liquid crystal display or an LED display, and further, an illumination device can be provided.

REFERENCE SIGNS LIST

1 . . . Semiconductor light-emitting device
10 . . . Semiconductor light-emitting element
15 . . . Submount
20 . . . Submount substrate
21, 24 . . . Submount wiring
31, 34 . . . Bump
100 . . . Laminated semiconductor layer
110 . . . Substrate
120 . . . Intermediate layer
130 . . . Base layer
140 . . . N-type semiconductor layer
150 . . . Light-emitting layer
160 . . . P-type semiconductor layer
180 . . . Protecting layer
200 . . . First electrode
210 . . . First transparent electrode layer
220 . . . Reflecting section
220a . . . Second transparent electrode layer
220b . . . Reflecting layer
220c . . . First barrier layer
230 . . . Overcoat section
230a . . . First bonding layer

230b . . . Second barrier layer
230c . . . First metal layer
230d . . . Second metal layer
230e . . . Second bonding layer
300 . . . Second electrode The invention is claimed:

1. A semiconductor light-emitting element comprising:
  a laminated semiconductor layer in which a first semiconductor layer having a first conduction type, a light-emitting layer and a second semiconductor layer having a second conduction type that is opposite to the first conduction type are laminated in order;
  a first transparent electrode layer that is provided on the laminated semiconductor layer, has transparency to light emitted from the light-emitting layer and is crystalline; and
  a reflecting section in which a second transparent electrode layer, a reflecting layer and a barrier layer are laminated in this order on the first transparent electrode layer, the second transparent electrode layer having transparency to the light and being non-crystalline, the reflecting layer being reflective to the light, the barrier layer suppressing movement of elements.

2. The semiconductor light-emitting element according to claim 1, wherein the first transparent electrode layer which is crystalline and the second transparent electrode layer which is non-crystalline are conductive oxides.

3. The semiconductor light-emitting element according to claim 1, wherein the first transparent electrode layer which is crystalline and the second transparent electrode layer which is non-crystalline are conductive oxides containing any one of indium (In) and titanium (Ti).

4. The semiconductor light-emitting element according to claim 1, wherein a thickness of the first transparent electrode layer which is crystalline is in a range of 5 nm or more to 500 nm or less.

5. The semiconductor light-emitting element according to claim 1, wherein a thickness of the second transparent electrode layer which is non-crystalline is in a range of 1 nm or more to 5 nm or less.

6. The semiconductor light-emitting element according to claim 1, wherein the reflecting layer is any one of Ag and a metal containing Ag.

7. The semiconductor light-emitting element according to claim 1, wherein, in the laminated semiconductor layer, the first conduction type of the first semiconductor layer is an n-type in which a carrier is an electron and the second conduction type of the second semiconductor layer is a p-type in which a carrier is a hole.

8. A semiconductor light-emitting device comprising:
  a semiconductor light-emitting element that includes:
    a laminated semiconductor layer in which a first semiconductor layer having a first conduction type, a light-emitting layer and a second semiconductor layer having a second conduction type that is opposite to the first conduction type are laminated in order;
    a first transparent electrode layer that is provided on the laminated semiconductor layer, has transparency to light emitted from the light-emitting layer and is crystalline; and
    a reflecting section in which a second transparent electrode layer, a reflecting layer and a barrier layer are laminated in this order on the first transparent electrode layer, the second transparent electrode layer having transparency to the light and being non-crystalline, the reflecting layer being reflective to the light, the barrier layer suppressing movement of elements; and
  a circuit board that is arranged to face a side including the reflecting layer of the semiconductor light-emitting element.

9. The semiconductor light-emitting device according to claim 8, wherein, in the semiconductor light-emitting element and the circuit board, a pair of positive and negative connecting electrodes provided on the side including the reflecting layer of the semiconductor light-emitting element is connected to a pair of wirings provided on the circuit board by a connector provided on the circuit board.

10. A method for producing a semiconductor light-emitting element, comprising:
  a process that forms a laminated semiconductor layer including a first semiconductor layer having a first conduction type, a light-emitting layer and a second semiconductor layer having a second conduction type that is opposite to the first conduction type;
  a process that forms a first transparent electrode layer on the laminated semiconductor layer, the first transparent electrode layer having transparency to light emitted from the light-emitting layer, and being crystalline; and
  a process that forms, on the first transparent electrode layer, a reflecting section including a second transparent electrode layer, a reflecting layer and a barrier layer, the second transparent electrode layer having transparency to the light and being non-crystalline, the reflecting layer being reflective to the light, the barrier layer suppressing movement of elements, the second transparent electrode layer, the reflecting layer and the barrier layer being laminated in this order.

11. The method for producing a semiconductor light-emitting element according to claim 10, wherein the process that forms a first transparent electrode layer includes a process that deposits a film to be the first transparent electrode layer and a process that applies heat treatment for crystallizing the film.

12. A method for producing a semiconductor light-emitting device, comprising:
  a process that performs alignment to bring a pair of positive and negative connecting electrodes provided on a side including a reflecting layer of a semiconductor light-emitting element into correspondence with a pair of wirings provided on a circuit board, the semiconductor light-emitting element including: a laminated semiconductor layer in which a first semiconductor layer having a first conduction type, a light-emitting layer and a second semiconductor layer having a second conduction type that is opposite to the first conduction type are laminated in order; a first transparent electrode layer that is provided on the laminated semiconductor layer, has transparency to light emitted from the light-emitting layer and is crystalline; and a reflecting section in which a second transparent electrode layer, the reflecting layer and a barrier layer are laminated in this order on the first transparent electrode layer, the second transparent electrode layer having transparency to the light and being non-crystalline, the reflecting layer being reflective to the light, the barrier layer suppressing movement of elements; and
  a process that heats and presses the semiconductor light-emitting element against the circuit board.

13. An illumination device comprising:
a semiconductor light-emitting device including:
- a semiconductor light-emitting element that includes:
  - a laminated semiconductor layer in which a first semiconductor layer having a first conduction type, a light-emitting layer and a second semiconductor layer having a second conduction type that is opposite to the first conduction type are laminated in order;
  - a first transparent electrode layer that is provided on the laminated semiconductor layer, has transparency to light emitted from the light-emitting layer and is crystalline; and
  - a reflecting section in which a second transparent electrode layer, a reflecting layer and a barrier layer are laminated in this order on the first transparent electrode laver, the second transparent electrode layer having transparency to the light and being non-crystalline, the reflecting layer being reflective to the light, the barrier layer suppressing movement of elements; and
- a circuit board that is arranged to face a side including the reflecting layer of the semiconductor light-emitting element, the semiconductor light-emitting device being incorporated into the illumination device.

14. An electronic apparatus comprising:
a semiconductor light-emitting device including:
- a semiconductor light-emitting element that includes:
  - a laminated semiconductor layer in which a first semiconductor layer having a first conduction type, a light-emitting layer and a second semiconductor layer having a second conduction type that is opposite to the first conduction type are laminated in order;
  - a first transparent electrode layer that is provided on the laminated semiconductor layer, has transparency to light emitted from the light-emitting layer and is crystalline; and
  - a reflecting section in which a second transparent electrode layer, a reflecting layer and a barrier layer are laminated in this order on the first transparent electrode laver, the second transparent electrode layer having transparency to the light and being non-crystalline, the reflecting layer being reflective to the light, the barrier layer suppressing movement of elements; and
- a circuit board that is arranged to face a side including the reflecting layer of the semiconductor light-emitting element, the semiconductor light-emitting device being incorporated into the electronic apparatus.

* * * * *